(12) United States Patent
Kang et al.

(10) Patent No.: US 11,625,070 B2
(45) Date of Patent: Apr. 11, 2023

(54) DISPLAY DEVICE

(71) Applicant: LG Display Co., Ltd., Seoul (KR)

(72) Inventors: ChounSung Kang, Gimpo-si (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/374,667

(22) Filed: Jul. 13, 2021

(65) Prior Publication Data
US 2022/0029124 A1 Jan. 27, 2022

(30) Foreign Application Priority Data
Jul. 23, 2020 (KR) .......................... 10-2020-0091767

(51) Int. Cl.
| | |
|---|---|
| G06F 1/16 | (2006.01) |
| H05K 5/02 | (2006.01) |
| H05K 5/00 | (2006.01) |
| H01L 51/52 | (2006.01) |
| G09G 3/20 | (2006.01) |
| G09G 3/00 | (2006.01) |

(52) U.S. Cl.
CPC .......... G06F 1/1652 (2013.01); H01L 51/524 (2013.01); G09G 3/035 (2020.08); G09G 3/20 (2013.01); G09G 2300/0443 (2013.01); H01L 2251/5338 (2013.01); H05K 5/0017 (2013.01); H05K 5/0217 (2013.01)

(58) Field of Classification Search
CPC ........... H01L 51/524; H01L 2251/5338; H01L 51/5253; H01L 51/5281; G09G 3/035; G09G 3/20; G09G 2300/0443; H05K 5/0017; H05K 5/0217
See application file for complete search history.

(56) References Cited

U.S. PATENT DOCUMENTS

| | | | | |
|---|---|---|---|---|
| 6,246,112 B1 * | 6/2001 | Ball | ................. | H01L 23/49822 257/691 |
| 2016/0374228 A1 * | 12/2016 | Park | ........................ | H05K 7/16 |
| 2018/0007747 A1 * | 1/2018 | Jung | ...................... | H05B 33/04 |
| 2019/0150300 A1 * | 5/2019 | Kim | ..................... | H05K 5/0217 361/807 |

FOREIGN PATENT DOCUMENTS

| | | | |
|---|---|---|---|
| KR | 10-2008-0009043 A | | 1/2008 |
| KR | 20210067146 A | * | 11/2019 |

* cited by examiner

*Primary Examiner* — Abhishek M Rathod
(74) *Attorney, Agent, or Firm* — Seed IP Law Group LLP

(57) ABSTRACT

A display device includes a display panel in which a plurality of pixels is defined, a back cover disposed on a rear surface of the display panel, a roller which is connected to the back cover to wind or unwind the back cover and the display panel, and a protective sheet which is disposed on a rear surface of the back cover and has a relatively small tensile strength in a rolling direction of the roller to reduce the stress generated during rolling and improve the lateral rigidity of the display unit.

19 Claims, 23 Drawing Sheets

DISPLAY DEVICE

CROSS-REFERENCE TO RELATED APPLICATIONS

This application claims priority to Korean Patent Application No. 10-2020-0091767 filed on Jul. 23, 2020 in the Korean Intellectual Property Office, the entire disclosure of which is incorporated herein by reference.

BACKGROUND

Technical Field

The present disclosure relates to a display device, and more particularly, to a rollable display device which is capable of displaying images even in a rolled state.

Description of the Related Art

As display devices which are used for a monitor of a computer, a television, or a cellular phone, there are an organic light emitting display device (OLED) which is a self-emitting device, a liquid crystal display device (LCD) which requires a separate light source, and the like.

An applicable range of the display device is diversified to personal mobile digital assistants as well as monitors of computers and televisions and a display device with a large display area and a reduced volume and weight is being studied.

Further, recently, a rollable display device is getting attention as a next generation display device.

BRIEF SUMMARY

An object to be achieved by the present disclosure is to provide a display device which reduces a stress generated during the rolling.

Another object to be achieved by the present disclosure is to provide a display device which improves a lateral rigidity of a display unit.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel in which a plurality of pixels is defined, a back cover disposed on a rear surface of the display panel, a roller which is connected to the back cover to wind or unwind the back cover and the display panel, and a protective sheet which is disposed on a rear surface of the back cover and has a relatively small tensile strength in a rolling direction of the roller.

According to another aspect of the present disclosure, a display device includes a display panel in which a plurality of pixels is defined, a back cover disposed on a rear surface of the display panel, an extending sheet which is disposed at a lower end of the back cover to be fastened with the back cover, a roller which is connected to the extending sheet to wind or unwind the back cover and the display panel, and a protective sheet which is disposed on a rear surface of the back cover and has a relatively small tensile strength in a rolling direction of the roller.

Other detailed matters of the exemplary embodiments are included in the detailed description and the drawings.

According to the present disclosure, an anisotropic sheet is applied to a rear surface of a back cover to reduce the stress generated by rolling a display unit and improve a lateral rigidity of the display unit. Accordingly, the reliability may be improved without increasing the cost.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
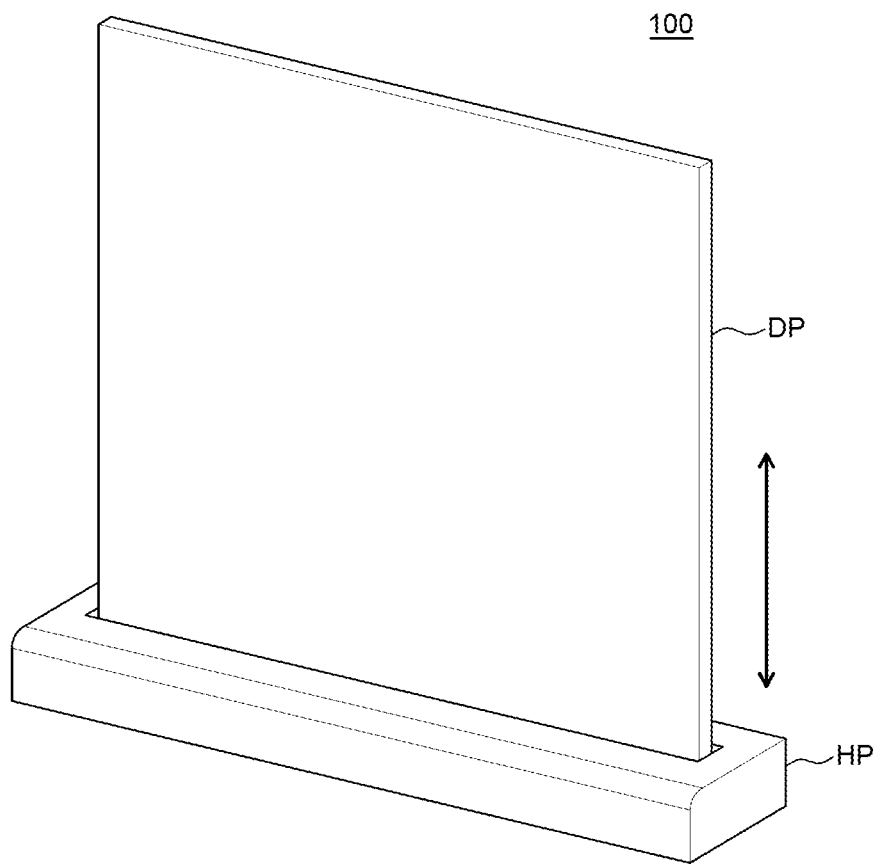
FIGS. 1A and 1B are perspective views of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next,". one or more parts may be positioned between the two parts unless the terms are used with the term "immediately" or "directly,"

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

Display Device-Rollable Display Device

First, a rollable display device may also be referred to as a display device which is capable of displaying images even though the display device is rolled. The rollable display device may have a high flexibility as compared with a general display device of the related art. Depending on whether to use a rollable display device, a shape of the rollable display device may freely vary. Specifically, when the rollable display device is not used, the rollable display device is rolled to be stored with a reduced volume. In contrast, when the rollable display device is used, the rolled rollable display device is unrolled to be used.

Figure 1B:
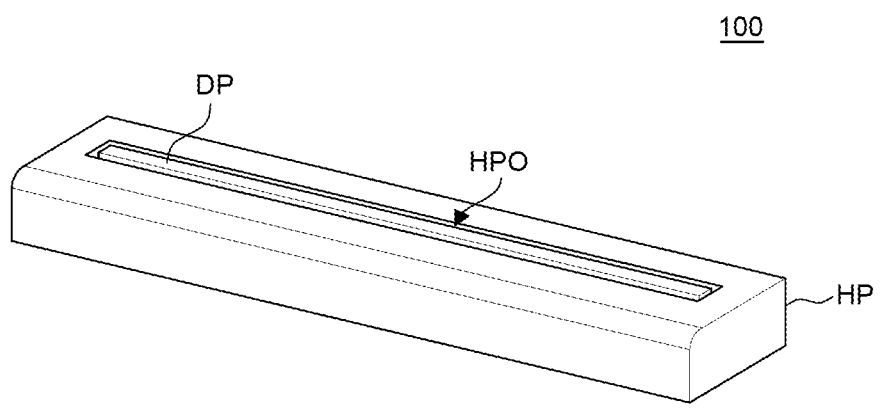

FIGS. 1A and 1B are perspective views of a display device according to a first exemplary embodiment of the present disclosure.

Referring to FIGS. 1A and 1B, a display device 100 according to a first exemplary embodiment of the present disclosure includes a display unit DP and a housing unit HP.

The display unit DP is a configuration for displaying images to a user and for example, in the display unit DP, a display element and a circuit, a wiring line, a component, etc. for driving the display element may be disposed.

In this case, since the display device 100 according to the first exemplary embodiment of the present disclosure is a rollable display device 100, the display unit DP may be configured to be wound and unwound. For example, the display unit DP according to the first exemplary embodiment of the present disclosure may be formed of a display panel and a back cover each having flexibility to be wound or unwound. The display unit DP will be described below in more detail with reference to FIGS. 5 to 8B.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO so that the display unit DP moves to the inside and the outside of the housing unit HP. The display unit DP may move in a vertical direction by passing through the opening HPO of the housing unit HP.

The display unit DP of the display device 100 may be switched from a fully unwound state to a fully wound state or from a fully wound state to a fully unwound state.

FIG. 1A illustrates the display unit DP of the display device 100 which is fully unwound as an example and in the fully unwound state, the display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound, it may be defined as a fully unwound state.

FIG. 1B illustrates the display unit DP of the display device 100 which is fully wound as an example and in the fully wound state, the display unit DP of the display device 100 is accommodated in the housing unit HP and cannot be further wound. That is, when the user does not watch the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state.

When the display unit DP is in a fully wound state to be accommodated in the housing unit HP, a volume of the display device 100 is reduced and the display device 100 may be easily carried.

In order to switch the display unit DP to a fully unwound state or a fully wound state, a driving unit which winds or unwinds the display unit DP may be disposed.

Driving Unit

Figure 2:
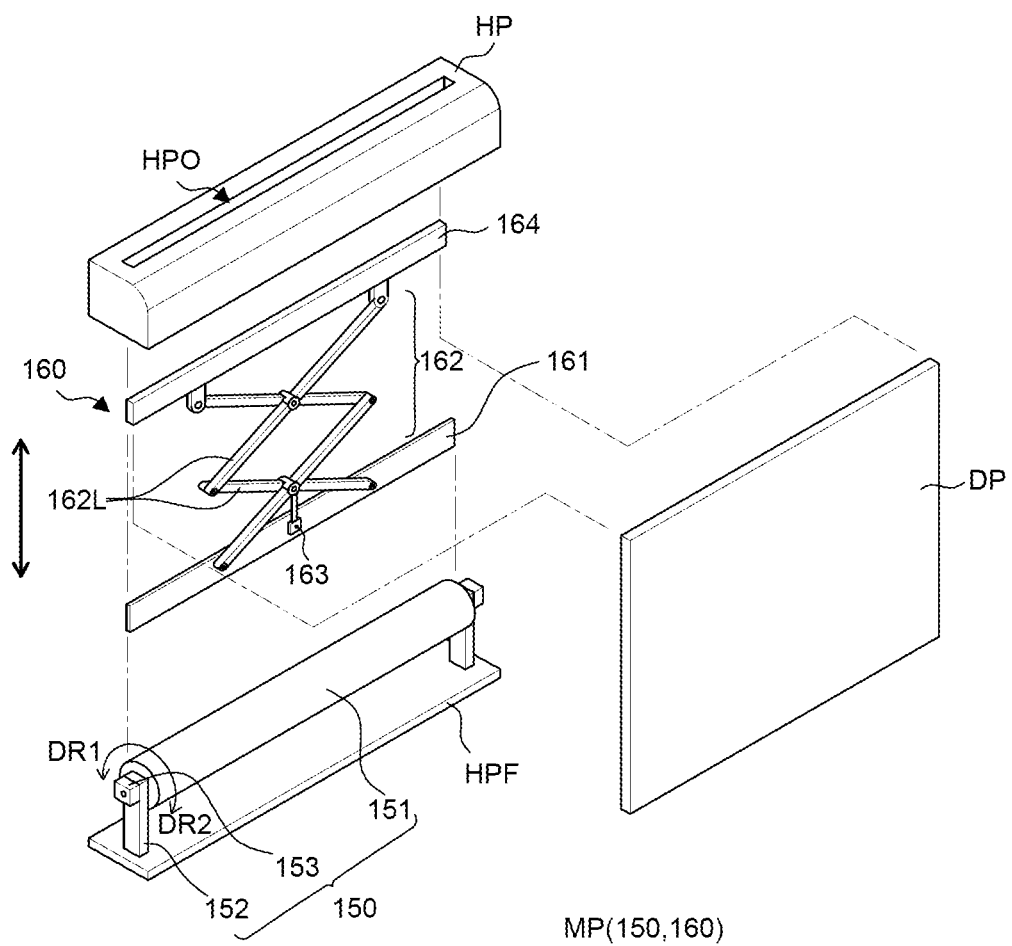
FIG. 2 is an exploded perspective view of a display device according to a first exemplary embodiment of the present disclosure.

FIG. 2 is an exploded perspective view of a display device according to a first exemplary embodiment of the present disclosure.

Figure 3:
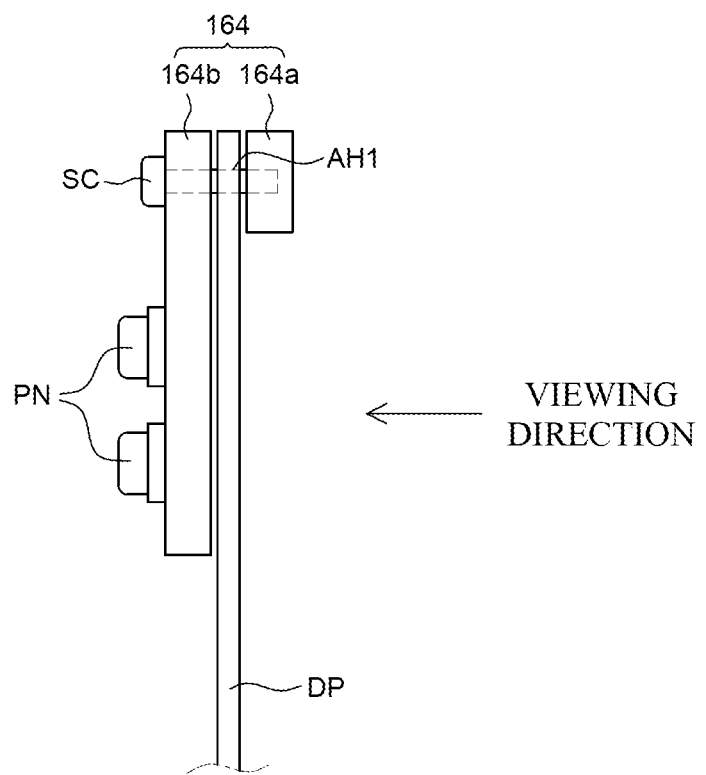
FIG. 3 is a schematic cross-sectional view for explaining a head bar and a display unit of a display device according to a first exemplary embodiment of the present disclosure.

FIG. 3 is a schematic cross-sectional view for explaining a head bar and a display unit of a display device according to a first exemplary embodiment of the present disclosure.

Figure 4:
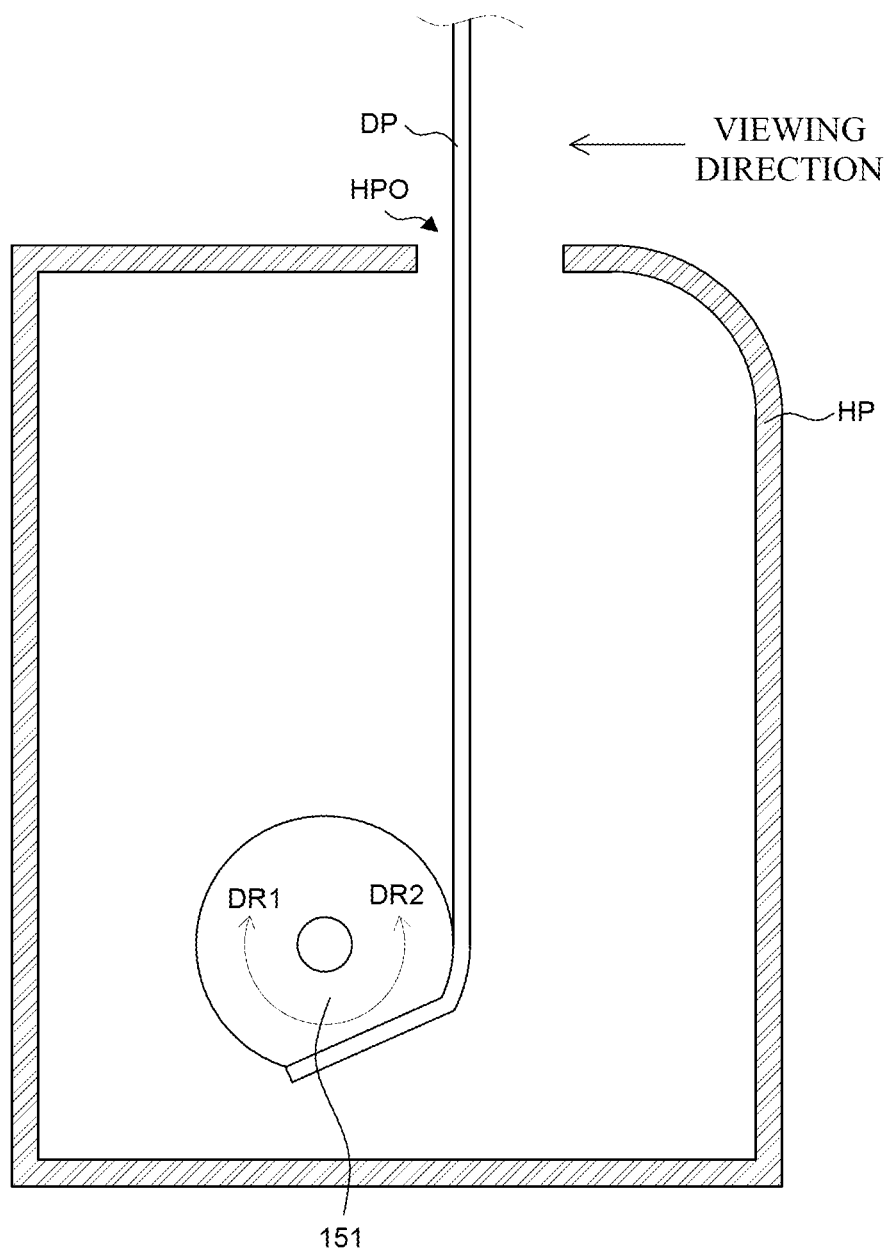
FIG. 4 is a cross-sectional view of a display device according to a first exemplary embodiment of the present disclosure.

FIG. 4 is a cross-sectional view of a display device according to a first exemplary embodiment of the present disclosure.

FIG. 4 is a schematic cross-sectional view for explaining a roller 151 and a display unit DP of a display device 100 according to a first exemplary embodiment of the present disclosure. However, the present disclosure is not limited to the structure illustrated in FIG. 4.

Further, for the convenience of description, FIG. 3 illustrates only a head bar 164 and a display unit DP and FIG. 4 illustrates only a housing unit HP, a roller 151, and a display unit DP.

Referring to FIG. 2, a driving unit MP includes a roller unit 150 and a lifting unit 160.

A roller unit 150 winds or unwinds the display unit DP fixed to the roller unit 150 while rotating in a first direction DR1 or a second direction DR2.

The roller unit 150 includes a roller 151, a roller support unit 152, and a roller rotating unit 153.

The roller 151 is a member around which the display unit DP is wound. The roller 151 may be, for example, formed to have a cylindrical shape. A lower edge of the display unit DP may be fixed to the roller 151. When the roller 151 rotates, the display unit DP which is fixed to the roller 151 through the lower edge may be wound around the roller 151. In contrast, when the roller 151 rotates in an opposite direction, the display unit DP which is wound around the roller 151 may be unwound from the roller 151. The roller 151 may be formed of a metal material or a plastic material having rigidity.

The roller support unit 152 may support the roller 151 at both sides of the roller 151. Specifically, the roller support unit 152 is disposed on a bottom surface HPF of the housing unit HP. Upper side surfaces of the roller support unit 152 are coupled to both ends of the roller 151. By doing this, the roller support unit 152 may support the roller 151 to be spaced apart from the bottom surface HPF of the housing unit HP. The roller 151 may be rotatably coupled to the roller support unit 152.

The roller rotating units 153 may rotate the roller 151 in the first direction DR1 or the second direction DR2. Roller rotating units 153 may be disposed in a pair of roller support units 152, respectively. For example, the roller rotating units 153 may be rotary motors which transmit a torque to the roller 151, but are not limited thereto.

The lifting unit 160 moves the display unit DP in a vertical direction in accordance with the driving of the roller unit 150. The lifting unit 160 includes a link support unit 161, a link unit 162, a link lifting unit 163, and a head bar 164.

The link support unit 161 may support the link unit 162 and the link lifting unit 163.

Specifically, the link support unit 161 may support the link unit 162 and the display unit DP which move in the vertical direction so as not to collide with a boundary of the opening HPO of the housing unit HP. The link support unit 161 may support the link unit 162 and the display unit DP to move only in a vertical direction without moving in a forward and backward direction.

The link unit 162 may include a plurality of links 162L which is hinged with each other. The plurality of links 162L is rotatably hinged to each other to move in the vertical direction by the link lifting unit 163. When the link unit 162 moves in the vertical direction, the plurality of links 162L rotates to be far away from each other or close to each other. A detailed description thereof will be made below with reference to FIG. 4.

The link lifting unit 163 may move the link unit 162 in the vertical direction. The link lifting unit 163 may rotate the plurality of links 162L of the link unit 162 to be close to each other or rotate the plurality of links 162L to be far away from each other. The link lifting unit 163 may lift or lower the link unit 162 to lift or lower the display unit DP connected to the link unit 162.

The link lifting unit 163 is driven to be synchronized with the roller rotating unit 153 so that the roller unit 150 and the lifting unit 160 may simultaneously operate. For example, when the display unit DP is switched from a fully unwound state to a fully wound state, the roller unit 150 operates to wind the display unit DP around the roller 151 and simultaneously with this, the lifting unit 160 may operate to rotate the plurality of links 162L of the link unit 162 to lower the display unit DP. Further, when the display unit DP is switched from a fully wound state to a fully unwound state, the roller unit 150 operates to unwind the display unit DP from the roller 151 and simultaneously with this, the lifting unit 160 operates to rotate the plurality of links 162L of the link unit 162 to lift the display unit DP.

The head bar 164 of the lifting unit 160 may be fixed to an uppermost end of the display unit DP. The head bar 164 is coupled to the link unit 162 to move the display unit DP in the vertical direction in accordance with the rotation of the plurality of links 162L of the link unit 162. That is, the display unit DP may be moved in a vertical direction by the head bar 164, the link unit 162, and the link lifting unit 163.

Referring to FIGS. 2 and 3 together, the head bar 164 may be disposed at the uppermost end of the display unit DP so as to enclose a front surface and a rear surface of the display unit DP.

The head bar 164 may include a first head bar 164a and a second head bar 164b. The first head bar 164a may cover a front surface of the display unit DP. The first head bar 164a may cover only a part of the front surface which is adjacent to an uppermost edge of the display unit DP so as not to hide an image displayed on the front surface of the display unit DP.

The second head bar 164b may cover a rear surface of the display unit DP. The second head bar 164b may cover a part of the rear surface of the display unit DP adjacent to the uppermost edge of the display unit DP. However, since no image is displayed on the rear surface of the display unit DP, the second head bar 164b may overlap the display unit DP more than the first head bar 164a.

In order to fasten the display unit DP with the first head bar 164a and the second head bar 164b, a first fastening hole AH1 may be formed in the display unit DP. A screw SC passes through the first fastening hole AH1 to fasten the first head bar 164a, the display unit DP, and the second head bar 164b.

Pem nuts PN to which the link unit 162 of the lifting unit 160 is fastened may be disposed in the second head bar 164b. The second head bar 164b and the link unit 162 of the lifting unit 160 may be fastened with each other by the pem nuts PN. Therefore, when the link unit 162 of the lifting unit 160 moves in the vertical direction, the second head bar 164b fastened with the link unit 162 and the first head bar 164a and the display unit DP fastened with the second head bar 164b may move together in the vertical direction.

Even though in FIG. 3, it is illustrated that the first head bar 164a and the second head bar 164b have a linear shape, the shapes of the first head bar 164*a* and the second head bar 164*b* may be changed in various forms and are not limited thereto.

Hereinafter, a driving operation of the driving unit MP will be described in detail with reference to FIG. 4 together.

Referring to FIGS. 2 to 4 together, a lower edge of the display unit DP may be coupled to the roller 151. When the roller 151 rotates in a first direction DR1, that is, a clockwise direction, by the roller rotating unit 153, the display unit DP may be wound around the roller 151 so that a rear surface of the display unit DP is in close contact with a surface of the roller 151.

In contrast, when the roller 151 rotates in a second direction DR2, that is, a counterclockwise direction, by the roller rotating unit 153, the display unit DP wound around the roller 151 is unwound from the roller 151 to be disposed at the outside of the housing unit HP.

In some exemplary embodiments, a driving unit MP having a different structure other than the above-described driving unit MP may also be applied to the display device 100. That is, as long as the display unit DP is wound and unwound, the above-described configuration of the roller unit 150 and the lifting unit 160 may be modified, some configuration may be omitted, or another configuration may be added.

Display Unit

Figure 5:
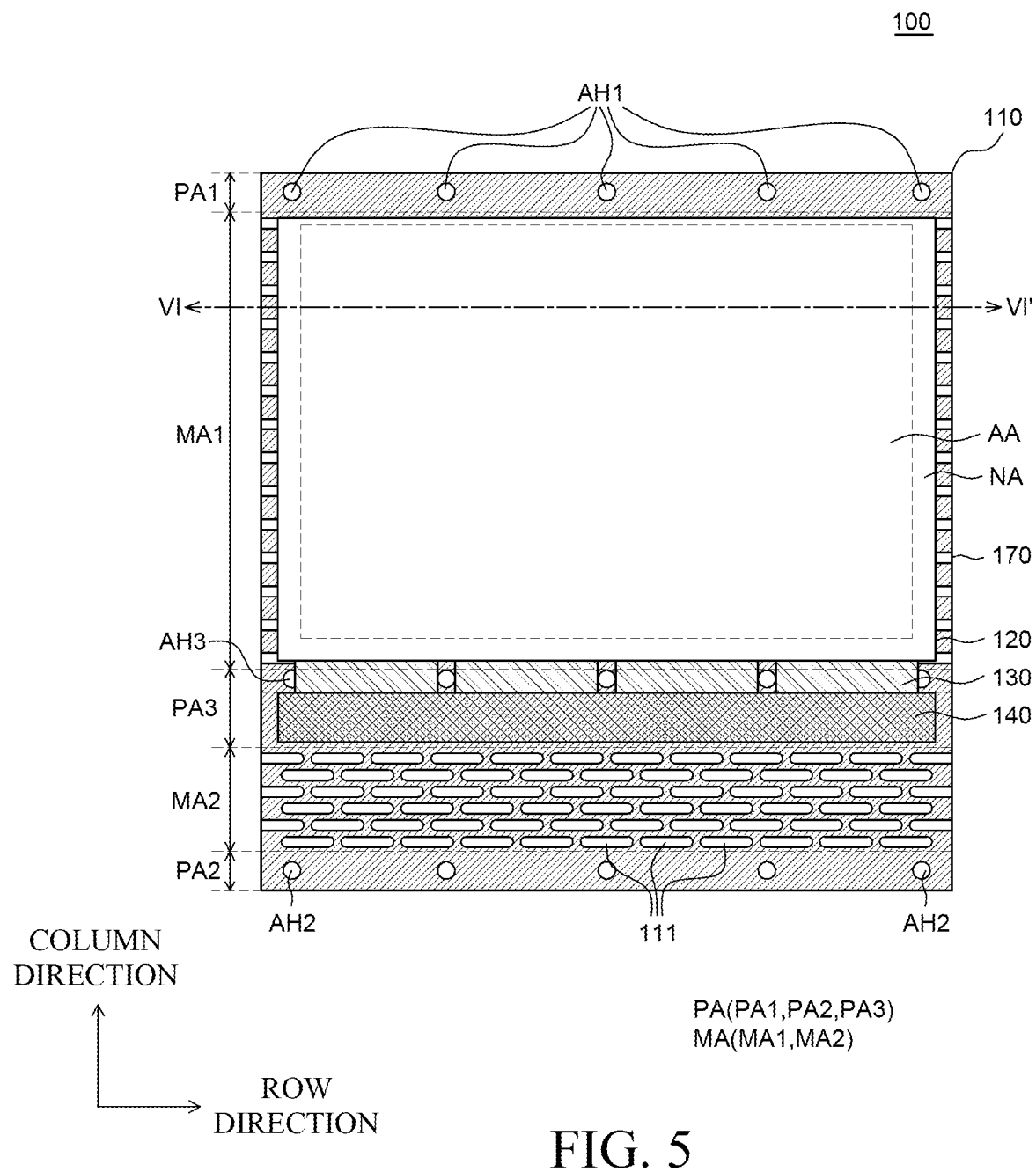
FIG. 5 is a plan view of a display device according to a first exemplary embodiment of the present disclosure.

FIG. 5 is a plan view of a display device according to a first exemplary embodiment of the present disclosure.

Figure 6:
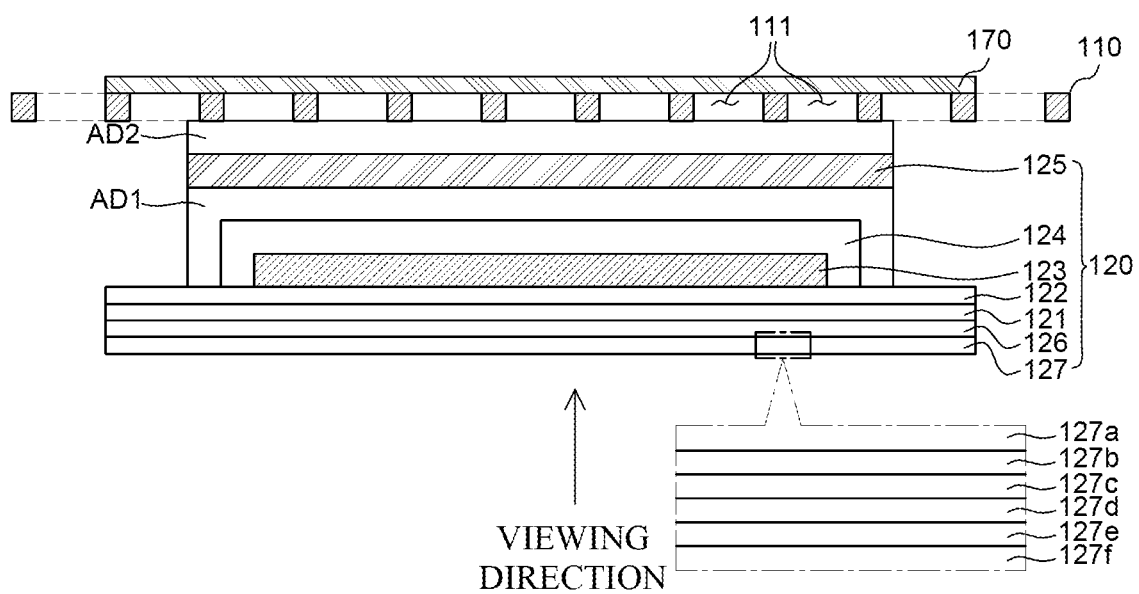
FIG. 6 is a cross-sectional view taken along the line VI-VI' of FIG. 5.

FIG. 6 is a cross-sectional view taken along the line VI-VI' of FIG. 5.

In FIG. 5, for the convenience of description, the roller unit and the lifting unit are not illustrated.

Referring to FIG. 5, the display unit DP includes a back cover 110, a display panel 120, a flexible film 130, and a printed circuit board 140.

The display panel 120 is a panel for displaying images to a user.

The display panel 120 may include a display element which displays images, a driving element which drives the display element, wiring lines which transmit various signals to the display element and the driving element, and the like. The display element may be defined in different ways depending on a type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to the first exemplary embodiment of the present disclosure is a rollable display device, the display panel 120 may be implemented as a flexible display panel to be wound around or unwound from the roller 151.

The display panel 120 may include a display area AA and a non-display area NA.

The display area AA is an area where images are displayed in the display panel 120.

In the display area AA, a plurality of subpixels which configures the plurality of pixels and a circuit for driving the plurality of subpixels may be disposed. The plurality of subpixels is minimum units which configure the display area AA and a display element may be disposed in each of the plurality of subpixels. The plurality of subpixels may configure a pixel. For example, an organic light emitting diode which includes an anode, an organic light emitting layer, and a cathode may be disposed in each of the plurality of subpixels, but it is not limited thereto. Further, a circuit for driving the plurality of subpixels may include a driving element, a wiring line, and the like. For example, the circuit may be configured by a thin film transistor, a storage capacitor, a gate line, a data line, and the like, but is not limited thereto.

The non-display area NA is an area where no image is displayed.

In the non-display area NA, various wiring lines and circuits for driving the organic light emitting diode of the display area AA may be disposed. For example, in the non-display area NA, a link line which transmits signals to the plurality of subpixels and circuits of the display area AA or a driving IC such as a gate driver IC or a data driver IC may be disposed, but the non-display area is not limited thereto.

The flexible film 130 is a film in which various components are disposed on a base film having a malleability. Specifically, the flexible film 130 is a film which supplies a signal to the plurality of subpixels and the circuits of the display area AA and may be electrically connected to the display panel 120. The flexible film 130 is disposed at one end of the non-display area NA of the display panel 120 to supply a power voltage, a data voltage, or the like to the plurality of subpixels and the circuits of the display area AA. Even though four flexible films 130 are illustrated in FIG. 5, the number of flexible films 130 may vary depending on the design and is not limited thereto.

In the meantime, for example, a driving IC such as a gate driver IC or a data driver IC may be disposed on the flexible film 130. The driving IC is a component which processes data for displaying images and a driving signal for processing the data. The driving IC may be disposed by a chip on glass (COG), a chip on film (COF), or a tape carrier package (TCP), or the like depending on a mounting method. However, for the convenience of description, it is described that the driving IC is mounted on the flexible film 130 by a chip on film manner, but is not limited thereto.

The printed circuit board 140 is disposed at one end of the flexible film 130 to be connected to the flexible film 130. The printed circuit board 140 is a component which supplies signals to the driving IC. The printed circuit board 140 may supply various signals such as a driving signal or a data signal to the driving IC. For example, a data driver which generates data signals may be mounted in the printed circuit board 140 and the generated data signal may be supplied to the plurality of subpixels and the circuit of the display panel 120 through the flexible film 130. In the meantime, even though one printed circuit board 140 is illustrated in FIG. 5, the number of printed circuit boards 140 may vary depending on the design, but is not limited thereto.

The back cover 110 is disposed on rear surfaces of the display panel 120, the flexible film 130, and the printed circuit board 140 to support the display panel 120, the flexible film 130, and the printed circuit board 140. Therefore, a size of the back cover 110 may be larger than a size of the display panel 120. Therefore, the back cover 110 may protect other configurations of the display unit DP from the outside. Even though the back cover 110 is formed of a material having a rigidity, at least a part of the back cover 110 may have a flexibility to be wound or unwound together with the display panel 120. For example, the back cover 110 may be formed of a metal material such as steel use stainless (SUS) or invar or plastic. However, as long as a material of the back cover 110 satisfies physical conditions such as a thermal strain amount, a radius of curvature, and a rigidity, various materials may be used, and is not limited thereto.

In the meantime, a protective sheet 170 of the present disclosure may be disposed on the rear surface of the back cover 110.

A size of the protective sheet 170 may be larger than the size of the display panel 120.

The protective sheet 170 may be an anisotropic sheet.

The protective sheet 170 may be an anisotropic sheet in which a fiber having a tensile property in a specific direction is woven.

A detailed description thereof will be made with reference to FIGS. 8A and 8B.

Referring to FIG. 6, the display panel 120 may include a substrate 121, a buffer layer 122, a pixel unit 123, an encapsulation layer 124, an encapsulation substrate 125, a barrier film 126, and a polarization plate 127.

The substrate 121 is a base member which supports various components of the display panel 120 and may be configured by an insulating material. The substrate 121 may be formed of a material having a flexibility to allow the display panel 120 to be wound or unwound and for example, may be formed of a plastic material such as polyimide (PI).

The buffer layer 122 may suppress moisture and/or oxygen which permeates from the outside of the substrate 121 from being spread. The buffer layer 122 may be configured by a single layer or a double layer of silicon oxide SiOx and silicon nitride SiNx, but is not limited thereto.

The pixel unit 123 may include a plurality of organic light emitting diodes and a circuit for driving the plurality of organic light emitting diodes. The pixel unit 123 may be an area corresponding to the display area AA. The organic light emitting diode may include an anode, an organic light emitting layer, and a cathode.

The anode may supply holes to the organic light emitting layer and be formed of a conductive material having a high work function. For example, the anode may be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to emit light. The organic light emitting layer may be formed of a red organic light emitting layer, a green organic light emitting layer, a blue organic light emitting layer, and a white organic light emitting layer depending on a color of light emitted from the organic light emitting layer. When the organic light emitting layer is a white organic light emitting layer, color filters having various colors may be additionally disposed.

The cathode may supply electrons to the organic light emitting layer and be formed of a conductive material having a low work function. For example, the cathode may be formed of any one or more selected from a group consisting of metals, such as magnesium (Mg), silver (Ag), and aluminum (Al), and an alloy thereof, but is not limited thereto.

The display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material and the cathode may be formed of the metal material having a high reflectance to allow the light emitted from the organic light emitting diode to travel to the lower portion of the substrate 121.

Hereinafter, for the convenience of description, the description will be made by assuming that the display device 100 according to an exemplary embodiment of the present disclosure is a bottom emission type display device, but it is not limited thereto.

A circuit for driving the organic light emitting diode is disposed in the pixel unit 123. The circuit may be formed of a thin film transistor, a storage capacitor, a gate line, a data line, a power line, and the like, but it may vary in various forms depending on the design of the display device 100.

The encapsulation layer 124 which covers the pixel unit 123 is disposed above the pixel unit 123. The encapsulation layer 124 seals the organic light emitting diode of the pixel unit 123. The encapsulation layer 124 may protect the organic light emitting diode of the pixel unit 123 from moisture, oxygen, and impacts of the outside. The encapsulation layer 124 may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulation substrate 125 is disposed above the encapsulation layer 124. The encapsulation substrate 125 protects the organic light emitting diode of the pixel unit 123 together with the encapsulation layer 124. The encapsulation substrate 125 may protect the organic light emitting diode of the pixel unit 123 from moisture, oxygen, and impacts of the outside. The encapsulation substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 125 is formed of a metal material, the encapsulation substrate 125 may be implemented by an ultra-thin film and have a high resistance against external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed so as to enclose the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulation layer 124 and the encapsulation substrate 125. The first adhesive layer AD1 may further include an absorbent. The absorbent may be particles having hygroscopicity and absorb moisture and oxygen from the outside to minimize permeation of the moisture and oxygen into the pixel unit 123.

The barrier film 126 may be disposed on an upper surface of the substrate 121. The barrier film 126 may protect the display panel 120 from impacts, moisture, and heat from the outside. The barrier film 126 may be configured by polymer resin having a characteristic which is light and unbreakable. For example, the barrier film 126 may be configured by cyclo olefin polymer (COP), but is not limited thereto and may also be configured by a material such as polyimide (PI), poly carbonate (PC), and polyethylene terephthalate (PET).

The polarization plate 127 is disposed on an upper surface of the barrier film 126.

The polarization plate 127 is a component which suppresses external light incident onto the display device 100 from being reflected to be visible. For example, the polarization plate 127 may include a surface layer 127f, a first protective layer 127e, a polarization layer 127d, a second protective layer 127c, a phase retardation layer 127b, and an adhesive layer 127a.

The surface layer 127f is disposed at the outermost side of the polarization plate 127 to enhance a mechanical strength of the polarization plate 127 and suppress the glare and reflection so that the visibility of the display device 100 may be improved. The surface layer 127f may be formed with a layer or a film formed by a surface processing method such as anti-glare (AG), semi glare (SG), low reflection (LR), and anti-glare and low reflection (AGLR), but is not limited thereto.

The adhesive layer 127a is disposed on a lowermost side of the polarization plate 127 to bond the polarization plate 127 to the barrier film 126. The adhesive layer 127a may be formed of a pressure sensitive adhesive (PSA), but is not limited thereto.

The phase retardation layer 127b may have a transmission axis of −45 degrees or +45 degrees with respect to an angle at which external light is polarized by the polarization layer 127d. Therefore, external light which is incident onto the phase retardation layer 127b passes through the phase retardation layer 127b to be circularly polarized.

The polarization layer 127d may linearly polarize light incident from the outside of the display device 100. Therefore, the polarization layer 127d may be formed of an oriented film formed of polyvinyl alcohol (PVA) based polymer film containing iodine or dichroic dye, but is not limited thereto.

The first protective layer 127e and the second protective layer 127c may be disposed on both surfaces of the polarization layer 127d. The polarization layer 127d is formed of a polyvinyl alcohol-based material which absorbs moistures so that the first protective layer 127e and the second protective layer 127c are disposed on both surfaces of the polarization layer 127d. Therefore, the damage of the polarization layer 127d due to heat or moisture may be suppressed. The first protective layer 127e and the second protective layer 127c may be formed of a material having no phase difference so as not to affect the polarized state of the polarization layer 127d. For example, the first protective layer 127e and the second protective layer 127c may be formed of a material such as triacetyl cellulose TAC, but is not limited thereto.

The back cover 110 may be disposed above the encapsulation substrate 125. The back cover 110 is disposed to be in contact with the encapsulation substrate 125 of the display panel 120 to protect the display panel 120. In order to protect the display panel 120, the back cover 110 may be formed of a material having a rigidity.

In the meantime, the back cover 110 may include a plurality of openings 111.

The plurality of openings 111 may allow the back cover 110 to have flexibility. The plurality of openings 111 may be flexibly deformed and allow the back cover 110 to be wound around the roller 151 or unwound from the roller 151 together with the display panel 120.

Hereinafter, the back cover 110 will be described in more detail with reference to FIGS. 7A and 7B.

Specific Configuration of Back Cover

Figure 7A:
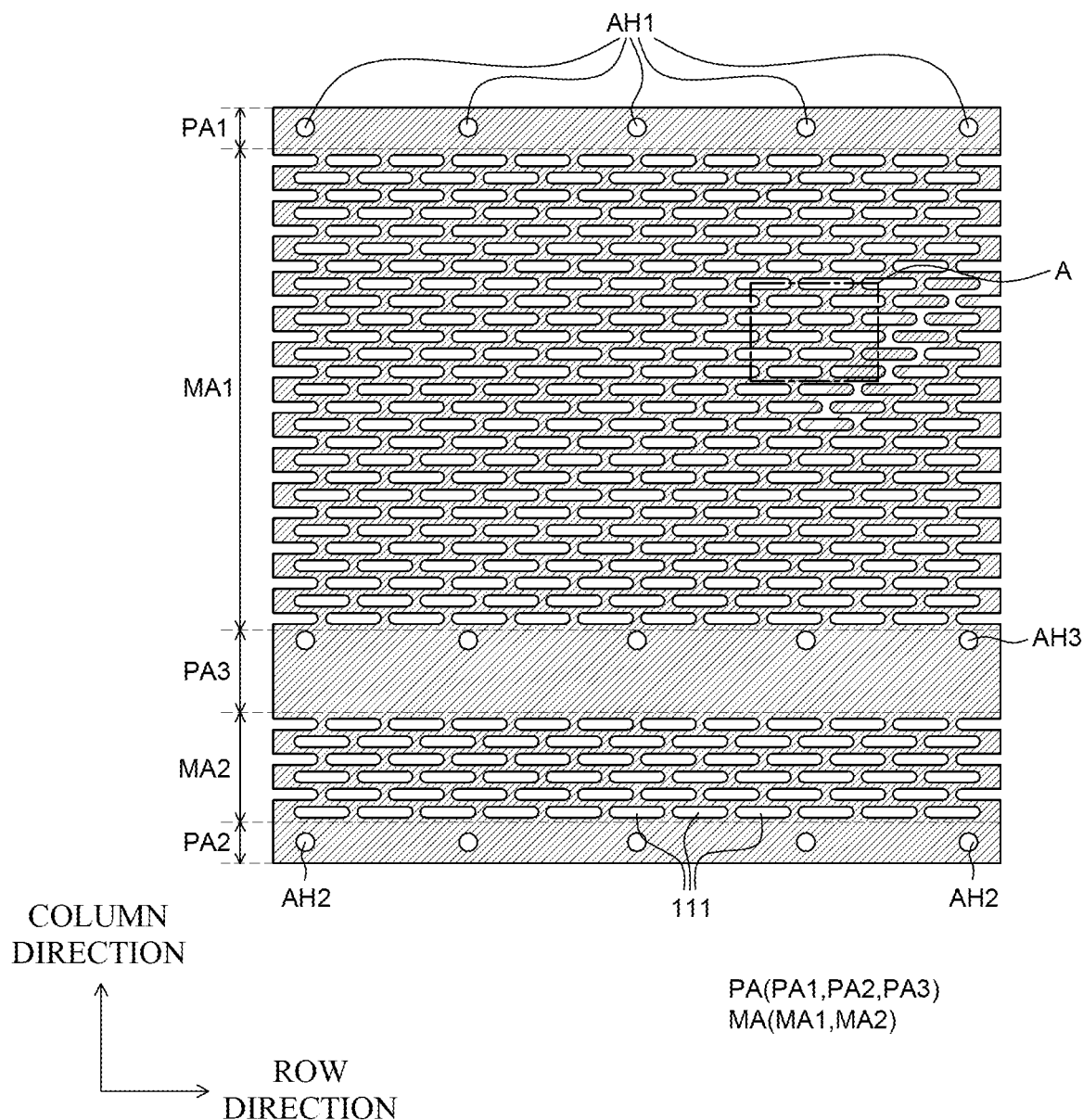
FIG. 7A is a plan view of a back cover of a display device according to a first exemplary embodiment of the present disclosure.

FIG. 7A is a plan view of a back cover of a display device according to a first exemplary embodiment of the present disclosure.

Figure 7B:
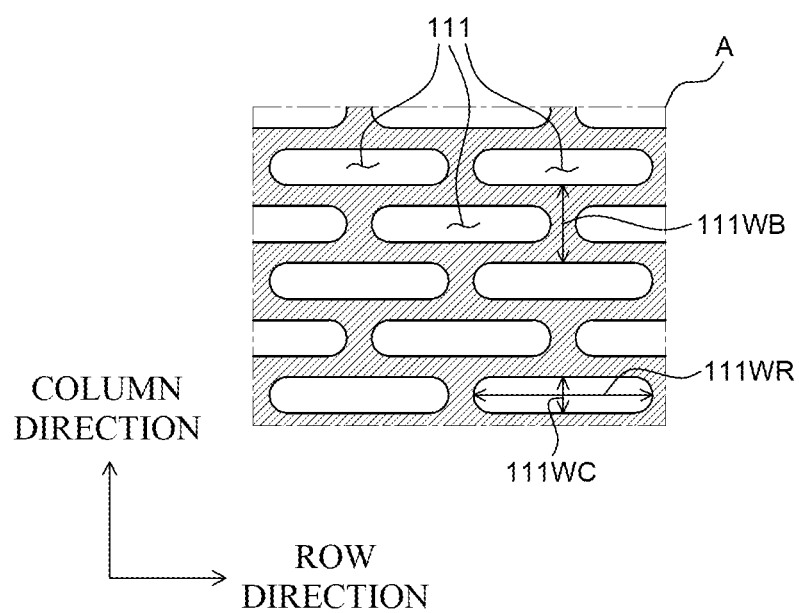
FIG. 7B is an enlarged view of a region A of FIG. 7A.

FIG. 7B is an enlarged view of a region A of FIG. 7A.

Referring to FIG. 7A, the back cover 110 may include a plurality of support areas PA and a plurality of malleable areas MA. The plurality of support areas PA is areas where a plurality of openings 111 is not disposed and the plurality of malleable areas MA is areas where a plurality of openings 111 is disposed. Specifically, a first support area PA1, a first malleable area MA1, a third support area PA3, a second malleable area MA2, and a second support area PA2 are sequentially disposed from the uppermost end of the back cover 110.

The first support area PA1 of the back cover 110 is an uppermost area of the back cover 110 and is fastened with the head bar 164. The first support area PA1 includes first fastening holes AH1 to be fastened with the head bar 164. As described in detail with reference to FIG. 3, screws SC which pass through the head bar 164 and the first fastening holes AH1 are disposed to fasten the head bar 164 with the first support area PA1 of the back cover 110. As the first support area PA1 is fastened with the head bar 164, when the link unit 162 which is fastened with the head bar 164 is lifted or lowered, the back cover 110 is also lifted and lowered together with the display panel 120 which is attached to the back cover 110.

In the meantime, the back cover 110 and the protective sheet 170 may be fastened with each other by means of the first fastening hole AH1. That is, the first support area PA1 of the back cover 110 and the upper end of the protective sheet 170 are fastened with each other by means of the first fastening hole AH1. For example, the head bar 164 is fastened with the first support area PA1 of the back cover 110 and the protective sheet 170 through screws SC which pass through the head bar 164 and the first fastening holes AH1.

Even though five first fastening holes AH1 are illustrated in FIG. 7A, the number of first fastening holes AH1 is not limited thereto. Further, even though in FIG. 7A, it has been described that the back cover 110 and the protective sheet 170 are fastened with the head bar 164 using the first fastening holes AH1, it is not limited thereto. Therefore, the back cover 110 and the protective sheet 170 may be fastened with the head bar 164 without using a separate fastening hole.

The first malleable area MA1 is an area extending from the first support area PA1 to a lower side of the back cover 110. The first malleable area MA1 is an area in which a plurality of openings 111 is disposed and the display panel 120 is attached.

When the display unit DP is wound around the roller to be accommodated in the housing unit HP, the first malleable area MA1 of the back cover 110 and the lower end portion and a center portion of the display panel 120 which are attached to the first malleable area MA1 may be wound around the roller. In this case, in the first malleable area MA1 of the back cover 110, the plurality of openings 111 is formed so that the first malleable area MA1 may have a high flexibility and may be easily wound around the roller together with the display panel 120.

The third support area PA3 is an area extending from the first malleable area MA1 to the lower side of the back cover 110. A flexible film 130 which is connected to one end of the display panel 120 and a printed circuit board 140 are attached to the third support area PA3.

The third support area PA3 may include third fastening holes AH3 to be fastened with the protective sheet 170. That is, the third support area PA3 of the back cover 110 and the lower end of the protective sheet 170 are fastened with each other by means of the third fastening hole AH3. Even though five third fastening holes AH3 are illustrated in FIG. 7A, the number of third fastening holes AH3 is not limited thereto.

Further, even though in FIG. 7A, it has been described that the back cover 110 is fastened with the protective sheet 170 using the third fastening holes AH3, it is not limited thereto and the back cover 110 and the protective sheet 170 may be fastened with each other without using a separate fastening hole.

In order to protect the flexible film 130 and the printed circuit board 140, the third support area PA3 may support the flexible film 130 and the printed circuit board 140 to be wound around the roller 151 in a planar shape, rather than a curved shape. Further, a part of the roller 151 may be formed to be flat, corresponding to the third support area PA3.

The second malleable area MA2 is an area extending from the third support area PA3 to a lower side of the back cover 110. A plurality of openings 111 may be disposed in the second malleable area MA2.

The second malleable area MA2 extends to dispose the display area AA of the display panel 120 at the outside of the housing unit HP. For example, when the back cover 110 and the display panel 120 are fully unwound, the second support area PA2 of the back cover 110 which is fixed to the roller 151 to the third support area PA3 to which the flexible film 130 and the printed circuit board 140 are attached may be disposed in the housing unit HP. The first malleable area MA1 and the third support area PA3 to which the display panel 120 is attached may be disposed at the outside of the housing unit HP.

The second support area PA2 of the back cover 110 is a lowermost area of the back cover 110 and is fastened with the roller 151. The second support area PA2 may include second fastening holes AH2 to be fastened with the roller 151. For example, screws SC which pass through the roller 151 and the second fastening holes AH2 are disposed to fasten the roller 151 and the second support area PA2 of the back cover 110 with each other. As the second support area PA2 is fastened with the roller 151, the back cover 110 may be wound around or unwound from the roller 151 by the rotation of the roller 151.

In the meantime, the back cover 110 and the protective sheet 170 may be fastened with each other by means of the second fastening holes AH2. That is, the second support area PA2 of the back cover 110 and the lower end of the protective sheet 170 are fastened with each other by means of the second fastening holes AH2. For example, screws SC which pass through the roller 151 and the second fastening holes AH2 are disposed to fasten the roller 151 with the second support area PA2 of the back cover 110 and the protective sheet 170.

Even though five second fastening holes AH2 are illustrated in FIG. 7A, the number of second fastening holes AH2 is not limited thereto.

The malleable area MA of the back cover 110 is an area which is wound around or unwound from the roller 151 together with the display panel 120. The malleable area MA may overlap at least the display panel 120 among other configurations of the display unit DP.

A plurality of openings 111 is disposed in the malleable area MA of the back cover 110. When the display unit DP is wound or unwound, the plurality of openings 111 may be deformed by a stress which is applied to the display unit DP. Specifically, when the display unit DP is wound or unwound, the malleable areas MA of the back cover 110 may be deformed as the plurality of openings 111 contracts or expands. Further, as the plurality of openings 111 contracts or expands, a slip phenomenon of the display panel 120 disposed on the malleable areas MA of the back cover 110 is minimized so that the stress which is applied to the display panel 120 may be minimized.

When the display panel 120 and the back cover 110 are wound, a difference between a length of the display panel 120 which is wound around the roller 151 and a length of the back cover 110 which is wound around the roller 151 may be caused due to the difference of radii of curvature of the display panel 120 and the back cover 110. For example, when the back cover 110 and the display panel 120 are wound around the roller 151, a length of the back cover 110 required for being wound around the roller 151 once may be different from a length of the display panel 120 required for being wound around the roller 151 once. That is, since the display panel 120 is disposed outer than the back cover 110 with respect to the roller 151, a length of the display panel 120 required to be wound around the roller 151 once may be larger than a length of the back cover 110 required to be wound around the roller 151 once. As described above, the winding lengths of the back cover 110 and the display panel 120 are different from each other due to the difference of radii of curvature at the time of winding the display unit DP and the display panel 120 attached to the back cover 110 may slide to move from its original position. In this case, a phenomenon that the display panel 120 slides from the back cover 110 due to the stress and the difference of radii of curvature caused by the winding may be defined as a slip phenomenon. When the slip phenomenon is excessively increased, the display panel 120 may be detached from the back cover 110 or defects such as cracks may be caused.

In this case, in the display device 100 according to the first exemplary embodiment of the present disclosure, even though the display unit DP is wound or unwound and a stress is applied to the display unit DP, the plurality of openings 111 of the back cover 110 is flexibly deformed to relieve the stress applied to the back cover 110 and the display panel 120. For example, when the back cover 110 and the display panel 120 are wound around the roller 151, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110.

Further, a stress which is applied to the display panel 120 from the back cover 110 due to the deformation of the plurality of openings 111 during the process of winding the back cover 110 and the display panel 120 may also be relieved.

Referring to FIGS. 7A and 7B, the plurality of openings 111 may be disposed to be staggered from a plurality of openings 111 in adjacent rows. For example, a plurality of openings 111 disposed in one row may be disposed to be staggered from a plurality of openings 111 disposed in a row adjacent to the row. Specifically, a center of the plurality of openings 111 disposed in an odd-numbered row and a center of the plurality of openings 111 disposed in an even-numbered row are disposed to be staggered and for example, may be staggered by a half of a width 111WR in a row direction of the openings 111. However, the arrangement of the plurality of openings 111 illustrated in FIG. 7A is just an example, and is not limited thereto.

As the plurality of openings 111 is disposed to be staggered, a distance 111WB between a plurality of openings 111 with centers matching in a column direction may be minimized. Specifically, an area between the plurality of openings 111 with centers matching in a column direction in the malleable area MA may have a rigidity. When the back cover 110 is wound, the back cover 110 needs to be bent in a column direction so that as the distance 111WB of some area between the plurality of openings 111 with centers matching in the column direction becomes longer, it may be difficult for the back cover 10 to be bent in the column direction. In this case, since the plurality of openings 111 is disposed to be staggered in the unit of row, as compared with the case that the openings are not staggered in the unit of row, the distance 111WB between the plurality of openings 111 with centers matching in the column direction may be minimized and the area between the plurality of openings 111 is also minimized. Accordingly, the distance 111WB between the plurality of openings 111 with centers matching in the column direction is reduced and continuously extends in the column direction in the malleable area MA so that an area where the plurality of openings 111 is not disposed is removed. Therefore, the distance 111WB of the area between the plurality of openings 111 having a rigidity in the column direction is minimized so that the rigidity of the back cover 111 may be improved without interrupting the winding or unwinding of the back cover 110.

Referring to FIG. 7B, a maximum width 111WR of the plurality of openings 111 in the row direction is larger than a maximum width 111WC in the column direction. That is, as illustrated in FIG. 7B, the maximum width 111WR of the plurality of openings 111 in a horizontal direction may be larger than the maximum width 111WC of the plurality of openings 111 in a vertical direction.

As the width 111WR of the plurality of openings 111 in the row direction is increased, the malleable area MA of the back cover 110 may be flexibly deformed. Specifically, when the back cover 110 is wound, the back cover 110 may be bent in the column direction of the back cover 110 and the stress may be applied so that the plurality of openings 111 extends in the column direction. In this case, when the width 111WR of the plurality of openings 111 in the row direction is increased, if the plurality of openings 111 is stretched in the column direction, the width 111WC of the plurality of openings 111 extending in the column direction may be increased. Further, as the plurality of openings 111 extends in the column direction, the stress applied to the malleable area MA may also be relieved. Therefore, the malleable area MA of the back cover 110 is easily wound or unwound by increasing the width 111WR of the plurality of openings 111 in the row direction and the stress applied to the malleable area MA may also be relieved.

The larger the width 111WC of the plurality of openings 111 in the column direction, the easier the plurality of openings 111 is processed. However, when the width 111WC of the plurality of openings 111 in the column direction is increased, an aperture ratio of the plurality of openings 111 is increased in the malleable area MA and a contact area of the display panel 120 which is attached to the malleable area MA and the back cover 110 is reduced. In this case, when the overlapping area of the display panel 120 and the back cover 110, that is, the contact area between the back cover 110 and the second adhesive layer AD2 is reduced, the back cover 110 and the second adhesive layer AD2 may be separated. Therefore, the adhesiveness may be controlled by adjusting the width 111WC of the plurality of openings 111 in the column direction so that the display panel 120 and the back cover 110 are not separated. Further, the width 111WR of the plurality of openings 111 in the row direction is adjusted to design the back cover 110 to have a high flexibility.

In the meantime, in the first support area PA1, the second support area PA2, and the third support area PA3, the plurality of openings 111 as formed in the malleable areas MA is not formed. That is, in the first support area PA1, the second support area PA2, and the third support area PA3, only the first fastening holes AH1, the second fastening holes AH2, and the third fastening holes AH3 are formed, but the plurality of openings 111 as formed in the malleable area MA is not formed.

Further, the first fastening holes AH1, the second fastening holes AH2, and the third fastening holes AH3 have different shapes from that of the plurality of openings 111.

In the meantime, the first support area PA1 and the second support area PA2 which are fixed to the head bar 164 and the roller 151, respectively, need to be more rigid than the malleable areas MA. As the first support area PA1 and the second support area PA2 have the rigidity, the first support area PA1 and the second support area PA2 may be firmly fixed to the head bar 164 and the roller 151. Therefore, the display unit DP is fixed to the roller 151 and the head bar 164 of the driving unit MP to be moved to the inside or the outside of the housing unit HP in accordance with the operation of the driving unit MP.

In the display device 100 according to the first exemplary embodiment of the present disclosure, the back cover 110 with the plurality of openings 111 formed therein is disposed on the rear surface of the display panel 120 to support and protect the display panel 120. The back cover 110 is formed of a metal material to have a rigidity and the plurality of openings 111 is formed in the malleable area MA of the back cover 110 where the display panel 120 is disposed so that the flexibility of the back cover 110 may be enhanced. Therefore, in a fully unwound state in which the display unit DP of the display device 100 is disposed at the outside of the housing unit HP, the back cover 110 which is formed of a rigid material to have a high rigidity may support the display panel 120 to be flatly spread. In contrast, in a fully wound state in which the display unit DP of the display device 100 is accommodated in the housing unit HP, the back cover 110 having a high flexibility due to the plurality of openings 111 is wound around the roller 151 together with the display panel 120 to be accommodated.

Further, in the display device 100 according to the first exemplary embodiment of the present disclosure, the width 111WR of the plurality of openings 111 in the row direction is adjusted so that the back cover 110 has a flexibility and thus the stress applied when the back cover 110 is wound may be relieved. When the back cover 110 and the display panel 120 are wound around the roller, the back cover 110 may be bent in the column direction and the stress may be applied so that the plurality of openings 111 extends in the column direction. The plurality of openings 111 is formed to have a large width 111WR in the row direction so that when the back cover 110 and the display panel 120 are wound around the roller 151, the plurality of openings 111 may easily be stretched and the stress applied to the back cover 110 may be relieved. Therefore, in the display device 100 according to the first exemplary embodiment of the present disclosure, the width 111WR of the plurality of openings 111 in the row direction is adjusted to enhance the flexibility of the back cover 110 and the back cover 110 and the display panel 120 may be easily wound around the roller 151. Further, the plurality of openings 111 expands in the column direction to relieve the stress applied to the back cover 110 and the display panel 120 so that the breakage of the display panel 120 may be reduced.

Further, in the display device 100 according to the first exemplary embodiment of the present disclosure, the width 111WC of the plurality of openings 111 in the column direction is adjusted to adjust the adhesiveness between the back cover 110 and the display panel 120. Specifically, the display panel 120 may be attached to the malleable area MA of the back cover 110. In this case, the larger the aperture ratio of the plurality of openings 111 disposed in the malleable area MA, the smaller the contact area of the display panel 120 and the back cover 110. Therefore, the adhesiveness between the display panel 120 and the back cover 110 may be reduced. However, in the display device 100 according to an exemplary embodiment of the present disclosure, the width 111WC of the plurality of openings 111 of the back cover 110 in the column direction is formed to be small to reduce the aperture ratio of the plurality of openings 111 and increase the contact area of the display panel 120 and the back cover 110. As described above, as the contact area of the display panel 120 and the back cover 110 is increased, the adhesiveness of the display panel 120 and the back cover 110 may be enhanced. Further, in the display device 100 according to the first exemplary embodiment of the present disclosure, the width 111WC of the plurality of openings 111 in the column direction is adjusted to ensure a predetermined level or higher of the adhesiveness between the back cover 110 and the display panel 120. By doing this, the separation between the back cover 110 and the display panel 120 does not occur.

Referring to FIG. 6 again, a second adhesive layer AD2 is disposed between the encapsulation substrate 125 and the back cover 110. The second adhesive layer AD2 may bond the encapsulation substrate 125 and the back cover 110 to each other. The second adhesive layer AD2 is formed of a material having adhesiveness and may be a thermosetting or natural curable type adhesive. For example, the second adhesive layer AD2 may be formed of an optical clear adhesive (OCA), a pressure sensitive adhesive (PSA), or the like, but is not limited thereto.

Even though in FIG. 6, it is illustrated that the plurality of openings 111 of the back cover 110 is not filled with the second adhesive layer AD2, the second adhesive layer AD2 may be filled in some or all of the plurality of openings 111. If the second adhesive layer AD2 is filled in the plurality of openings 111 of the back cover 110, a contact area between the second adhesive layer AD2 and the back cover 110 is increased so that a separation phenomenon may be avoided.

In the meantime, a protective sheet 170 of the present disclosure may be disposed on the rear surface of the back cover 110.

A size of the protective sheet 170 may be equal to or larger than the size of the display panel 120.

The protective sheet 170 may be an anisotropic sheet.

The protective sheet 170 may be an anisotropic sheet in which a fiber having a tensile property in a specific direction is woven.

Hereinafter, the protective sheet 170 will be described in more detail with reference to FIGS. 8A and 8B together.

Specific Configuration of Protective Sheet

Figure 8A:
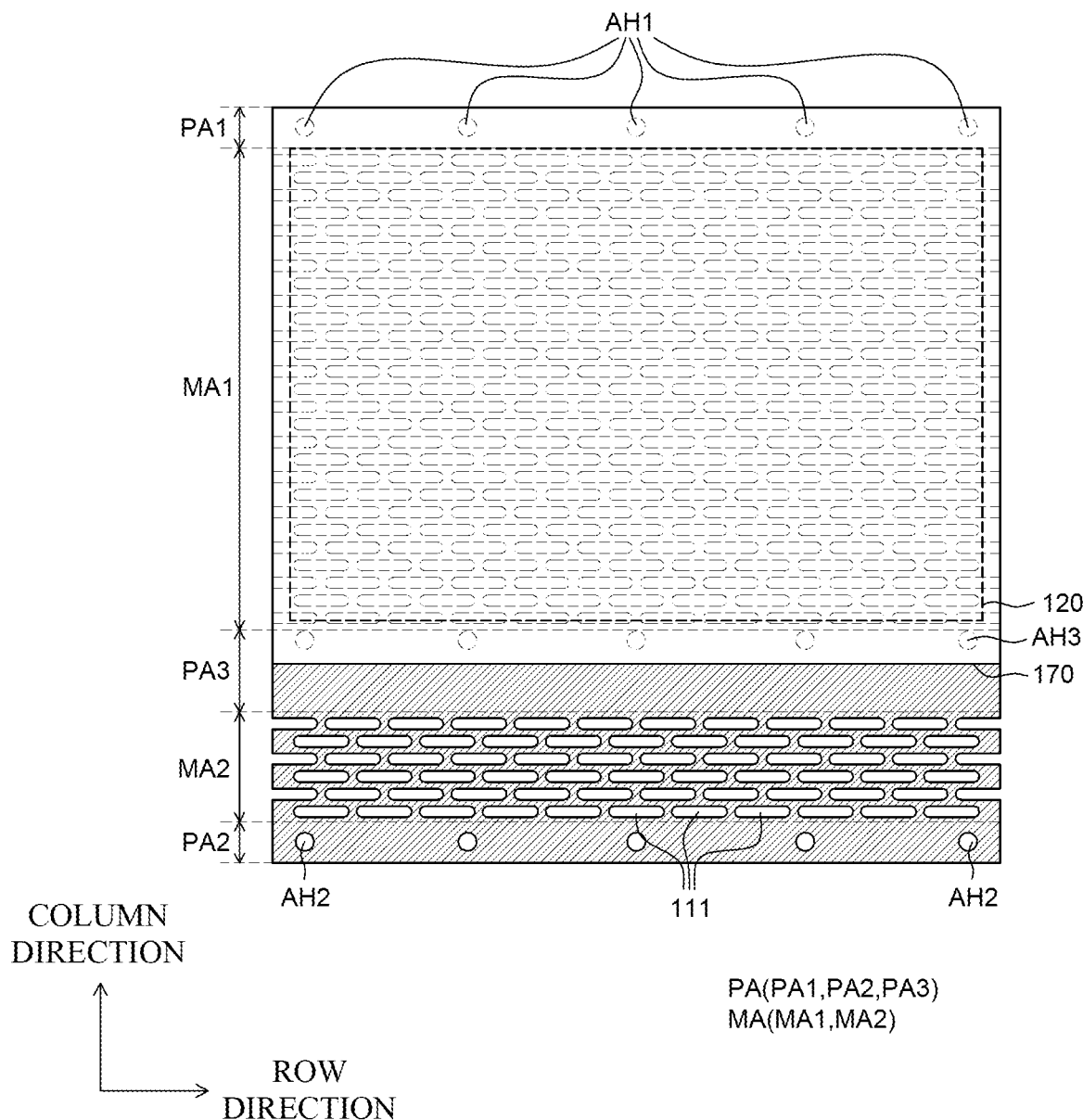
FIG. 8A is a rear view of a display device according to a first exemplary embodiment of the present disclosure.

FIG. 8A is a rear view of a display device according to a first exemplary embodiment of the present disclosure.

Figure 8B:
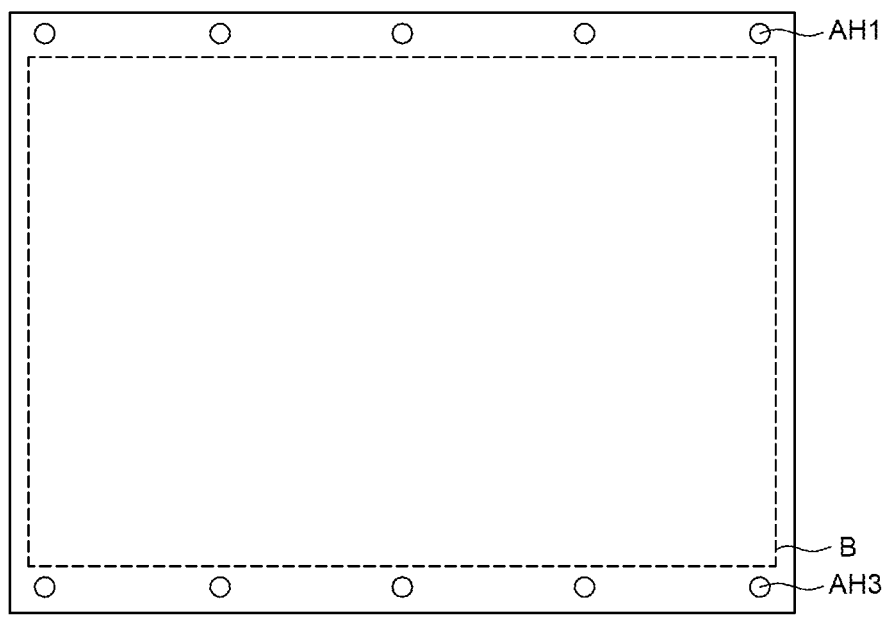
FIG. 8B is a plan view of a protective sheet according to a first exemplary embodiment of the present disclosure.

FIG. 8B is a plan view of a protective sheet according to a first exemplary embodiment of the present disclosure.

In FIG. 8A, for the convenience of description, among various configurations of the display device 100, only the back cover 110 and the protective sheet 170 are schematically illustrated and the display panel 120 is illustrated with dotted lines. In FIG. 8B, only the protective sheet 170 is schematically illustrated.

In FIGS. 8A and 8B, it is assumed that a rolling direction of the roller is parallel to a column direction.

Referring to FIGS. 8A and 8B, the protective sheet 170 may be disposed on the rear surface of the back cover 110. Specifically, the protective sheet 170 may be disposed on an opposite surface of one surface of the back cover 110 on which the display panel 120 is disposed. The protective sheet 170 may be disposed to overlap the polarization plate 127 disposed on the display panel 120.

A size of the protective sheet 170 may be equal to or larger than the size of the display panel 120.

The protective sheet 170 according to the first exemplary embodiment of the present disclosure may be disposed so as to overlap the edge of the back cover 110. That is, the protective sheet 170 according to the first exemplary embodiment of the present disclosure may also be disposed at the edge of the back cover 110 in which the display panel 120 is not disposed. However, the present disclosure is not limited thereto.

At least one first fastening hole AH1 may be formed at an upper end of the protective sheet 170. The back cover 110 and the protective sheet 170 may be fastened with each other by means of the first fastening hole AH1. That is, the first support area PA1 of the back cover 110 and the upper end of the protective sheet 170 are fastened with each other by means of the first fastening hole AH1.

Even though five first fastening holes AH1 are illustrated in FIGS. 8A and 8B, the number of first fastening holes AH1 is not limited thereto.

At least one third fastening hole AH3 is formed at a lower end of the protective sheet 170. The back cover 110 and the protective sheet 170 may be fastened with each other by means of the third fastening hole AH3. That is, the third support area PA3 of the back cover 110 and the lower end of the protective sheet 170 are fastened with each other by means of the third fastening hole AH3.

Even though five third fastening holes AH3 are illustrated in FIGS. 8A and 8B, the number of third fastening holes AH3 is not limited thereto.

Further, in FIGS. 8A and 8B, it has been described that the protective sheet 170 is fastened with the back cover 110 using the first fastening hole AH1 and the third fastening hole AH3. However, the present disclosure is not limited thereto so that the back cover 110 and the protective sheet 170 may be fastened with each other without using a separate fastening hole. That is, instead of the fastening hole, an adhesive layer is provided on one surface of the protective sheet to be attached to the back cover.

The protective sheet 170 may be an anisotropic sheet.

The protective sheet 170 may be an anisotropic sheet in which a fiber having a tensile property in a specific direction is woven. For example, the protective sheet 170 may be configured by an anisotropic sheet in which a tensile strength is relatively small in the rolling direction of the roller 151, that is, in a row direction and the tensile strength is relatively large in the column direction. For example, the direction in which the tensile strength is small may refer to a direction in which the fiber is woven, but the present disclosure is not limited thereto, so that the direction may refer to a direction in which the protective sheet 170 is well extended regardless of the direction in which the fiber is woven. In the meantime, the tensile strength is substantially inversely proportional to the tensile modulus. For example, the protective sheet 170 may be configured by an anisotropic sheet in which a tensile modulus is relatively large in the rolling direction of the roller 151, that is, in a column direction and the tensile modulus is relatively small in the row direction.

As described above, according to the first exemplary embodiment of the present disclosure, the protective sheet 170 having a tensile characteristic in a specific direction is applied to the rear surface of the back cover 110. Accordingly, it is possible to reduce the stress generated when the display unit DP is rolled and improve the lateral rigidity of the display unit DP.

That is, until now, there has been an effort to ensure a rolling characteristic and improve the lateral rigidity of the back cover. Even though the problem has been partially improved by locally forming a minute pattern at the edge of the back cover, there is a problem in that when an external impact is applied, the pattern unit is significantly deformed. That is, the back cover having a minute pattern has a weak impact resistance so that when a side surface is hit, the back cover may be deformed, which causes a driving failure of the display panel. Further, even though the problem has been partially improved by filling the edge and the rear surface of the back cover with the resin, the defect is increased due to the complex process, and problems such as the reliability problem and the increased cost still remain.

In the meantime, the polarization plate of the display device includes a polyvinyl alcohol-based polymer film for polarization of the incident light as a polarization layer. However, the polyvinyl alcohol-based polymer material is formed of a material having a good hygroscopicity, so that the volume changes in accordance with the humidity. That is, the polarization layer absorbs moisture in a high humidity environment to expand and discharges the moisture in a low humidity environment to shrink so that warpage is generated in the stretching direction, which causes the warpage in the polarization plate and the display panel with the polarization plate attached thereto.

Accordingly, in the display device 100 according to the first exemplary embodiment of the present disclosure, the protective sheet 170 in which the tensile characteristic is controlled along a specific direction is disposed on the rear surface of the back cover 110. By doing this, the lateral rigidity is improved while ensuring the rolling characteristic of the back cover 110 and the warpage of the display panel 120 generated due to the expansion of the polarization plate 127 may be improved.

That is, the protective sheet 170 of the present disclosure needs to have different tensile characteristics in a direction horizontal with the rolling and a direction perpendicular to the rolling. First, the tensile characteristic needs to be good in the rolling direction so that the stress is not increased when the back cover 110 is rolled and the rigidity needs to be good in the direction perpendicular to the rolling so that the lateral rigidity is effectively improved.

In the protective sheet 170 of the present disclosure, when a small tensile strength is set in a panel area B to which the display panel 120 is attached to be well rollable, the rolling force is reduced so that the rolling stress applied to the display panel 120 during the rolling may be reduced. Further, an outer periphery of the edge of the panel area B needs to protect the display panel 120 from the external impact and also needs to be rollable. Accordingly, in order to reduce the stress generated when the back cover 110 is rolled and improve the lateral rigidity of the display unit DP, a different tensile characteristic is required in a specific direction.

Accordingly, as described above, the protective sheet 170 according to the first exemplary embodiment of the present disclosure may be an anisotropic sheet in which a fiber having a different tensile characteristic in a specific direction is woven. For example, the protective sheet 170 may be configured by an anisotropic sheet in which the tensile strength is relatively small in the rolling direction (a column direction) of the roller 151 and the tensile strength is relatively large in a direction perpendicular to the rolling of the roller 151 (a horizontal direction). Here, the direction in which the tensile strength is small may refer to a direction in which the fiber is woven, but the present disclosure is not limited thereto, so that the direction may refer to a direction in which the protective sheet 170 is well extended regardless of the direction in which the fiber is woven. That is, the direction and the tensile characteristic may be controlled by adjusting a fiber weaving structure and material.

Specifically, according to the first exemplary embodiment of the present disclosure, the protective sheet 170 may be disposed not only in the panel area B to which the display panel 120 is attached, but also in the upper end, the lower end, and the edge of the panel area B. That is, the protective sheet 170 according to the first exemplary embodiment of the present disclosure may be disposed in the entire first support area PA1 and the entire first malleable area MA1 of the back cover 110, and in a part of the third support area PA3. However, the present disclosure is not limited thereto.

Further, according to the first exemplary embodiment of the present disclosure, the anisotropic sheet in which the tensile strength is relatively small in the rolling direction and the tensile strength is relatively large in a direction perpendicular to the rolling direction is configured on the entire surface of the protective sheet 170. However, the present disclosure is not limited thereto.

Accordingly, according to the present disclosure, the protective sheet 170 is applied to simultaneously ensure the rolling characteristic of the back cover 110 and improve the lateral rigidity. That is, in the rolling direction, the tensile strength of the protective sheet 170 has a relatively small value so that the stress when the back cover 110 is rolled is reduced to improve the rolling reliability. Further, in the direction perpendicular to the rolling, the tensile strength of the protective sheet 170 has a relatively large value so that the deformation of the back cover 110 due to the side impact is reduced to improve the lateral rigidity.

For example, as a lateral rigidity evaluation result, when the protective sheet is applied, if a test ball drops on the side surface of the back cover at angles of 60 degrees, 70 degrees, and 79.6 degrees, it is confirmed that the deformation is significantly reduced as compared with an example that the protective sheet is not applied.

Further, as a curl evaluation result, when the protective sheet of the present disclosure is applied, it is confirmed that the tensile strength in the direction perpendicular to the rolling is large so that the curl level in accordance with the bending of the display panel is relieved.

Various Exemplary Embodiments of Protective Sheet

In the protective sheet of the present disclosure, the tensile strength is increased in all directions of a portion corresponding to the edge of the back cover to further improve the lateral rigidity of the back cover, which will be described in detail with reference to a second exemplary embodiment of the present disclosure.

Figure 9A:
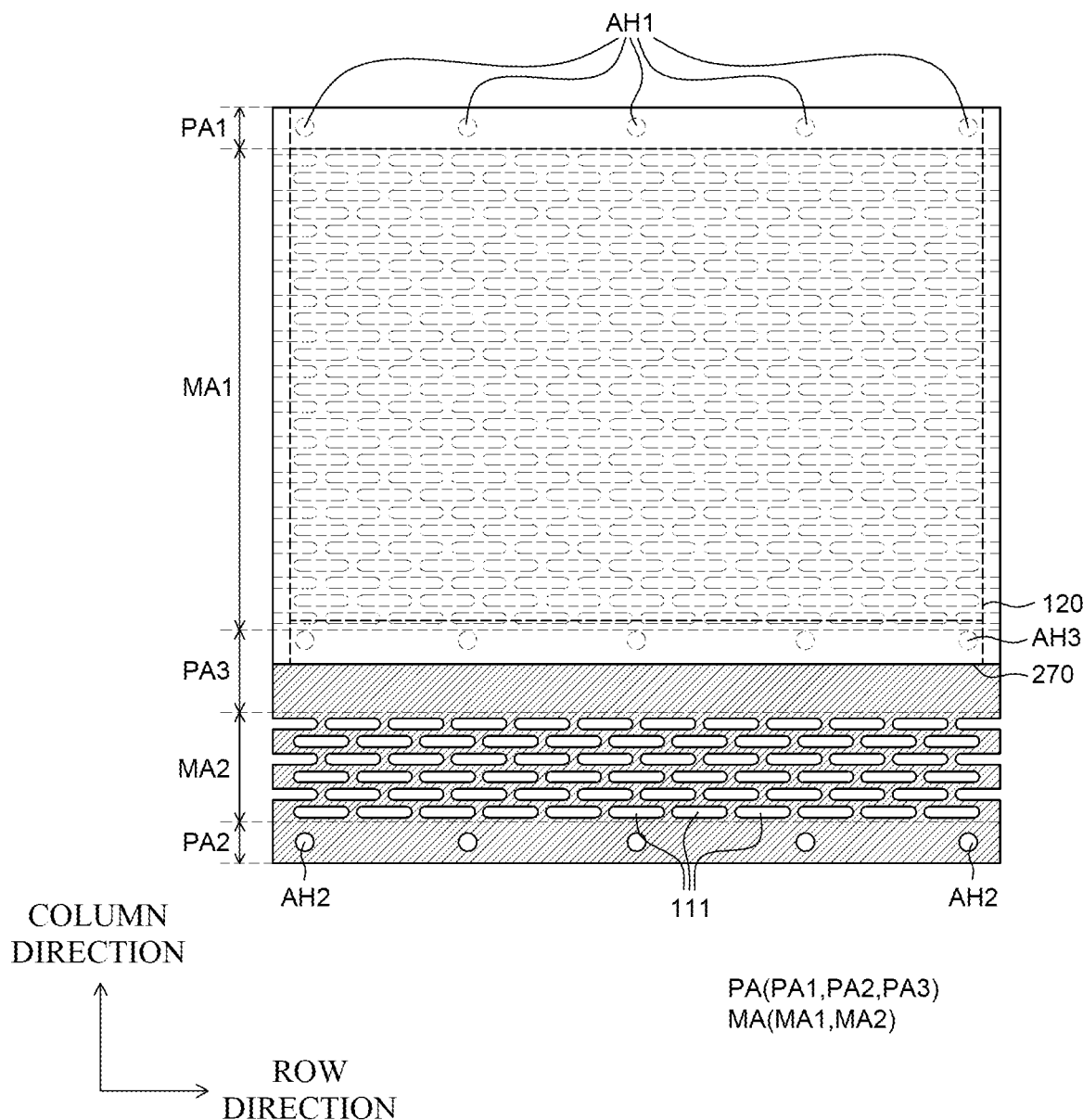
FIG. 9A is a rear view of a display device according to a second exemplary embodiment of the present disclosure.

FIG. 9A is a rear view of a display device according to a second exemplary embodiment of the present disclosure.

Figure 9B:
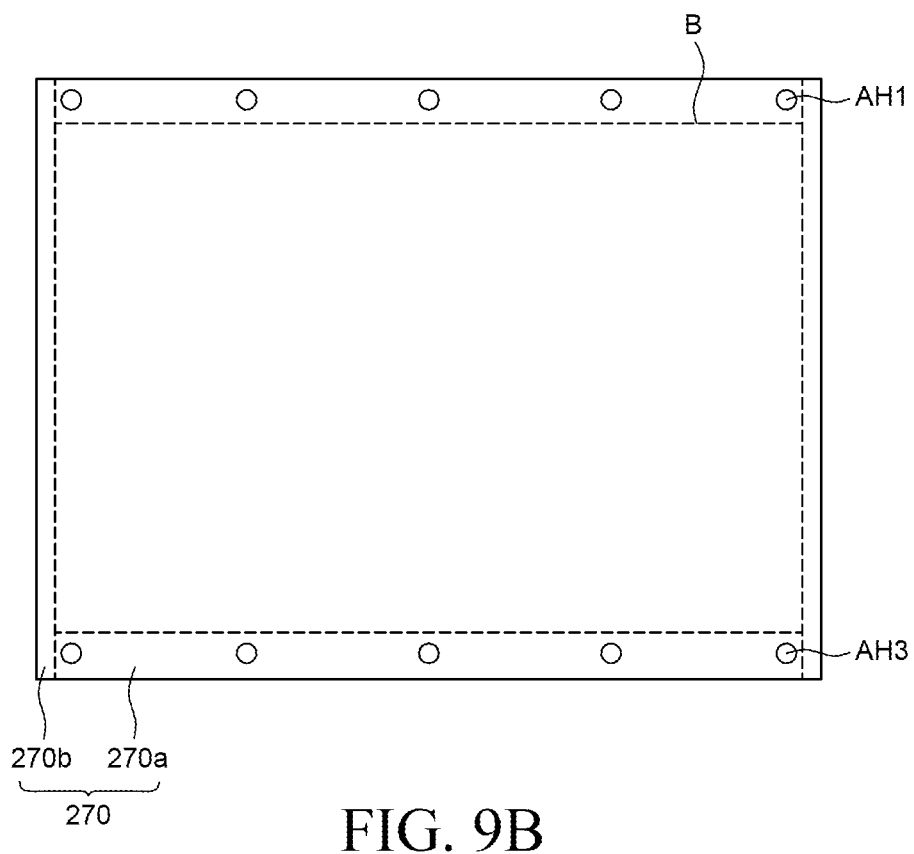
FIG. 9B is a plan view of a protective sheet according to a second exemplary embodiment of the present disclosure.

FIG. 9B is a plan view of a protective sheet according to a second exemplary embodiment of the present disclosure.

As compared with the display device 100 of FIGS. 8A and 8B, in the display device 200 of FIGS. 9A and 9B, only a configuration of a protective sheet 270 is different, but other configurations are substantially the same so that a redundant description will be omitted. The same configuration will be denoted with the same reference numeral.

In FIG. 9A, for the convenience of description, among various configurations of the display device 200, only a back cover 110 and a protective sheet 270 are schematically illustrated and a display panel 120 is illustrated with dotted lines. In FIG. 9B, only the protective sheet 270 is schematically illustrated.

In FIGS. 9A and 9B, it is assumed that a rolling direction of the roller is parallel to a column direction.

Referring to FIGS. 9A and 9B, in the display device 200 according to the second exemplary embodiment of the present disclosure, the protective sheet 270 is disposed on the rear surface of the back cover 110.

Specifically, the protective sheet 270 may be disposed on an opposite surface of one surface of the back cover 110 on which the display panel 120 is disposed. As described above, the protective sheet 270 may be disposed to overlap a polarization plate 127 disposed on the display panel 120.

A size of the protective sheet 270 may be equal to or larger than the size of the display panel 120.

Similarly to the above-described first exemplary embodiment of the present disclosure, the protective sheet 270 according to the second exemplary embodiment of the present disclosure may be disposed so as to overlap the edge of the back cover 110. That is, the protective sheet 270 according to the second exemplary embodiment of the present disclosure may also be disposed at the edge of the back cover 110 in which the display panel 120 is not disposed, but is not limited thereto.

The protective sheet 270 according to the second exemplary embodiment of the present disclosure may be divided into at least two regions with different structures. That is, for example, the protective sheet 270 according to the second exemplary embodiment of the present disclosure includes a first protective sheet 270a and a second protective sheet 270b. The first protective sheet 270a is disposed in a panel area B, in which the display panel 120 is disposed, the back cover 110 of upper and lower ends of the panel area B, and the second protective sheet 270b is disposed in the back cover 110 of an edge of the panel area B. However, the present disclosure is not limited thereto and the second protective sheet 270b may be disposed in the back cover 110 at the upper and lower ends of the panel area B. Alternatively, a third protective sheet having a characteristic different from those of the first and second protective sheets 270a and 270b may be disposed in the back cover 110 of the upper and lower ends of the panel area B.

The first protective sheet 270a according to the second exemplary embodiment of the present disclosure may be disposed not only in the panel area B in which the display panel 120 is attached, but also in the back cover 110 of the upper end and the lower end of the panel area B. That is, the first protective sheet 270a may be disposed in the entire first support area PA1 and the entire first malleable area MA1 of the back cover 110, and a part of the third support area PA3 excluding the edge, but is not limited thereto.

Further, the second protective sheet 270b according to the second exemplary embodiment of the present disclosure may be disposed in the back cover 110 of the edge of the panel area B.

The first protective sheet 270a may be an anisotropic sheet.

The first protective sheet 270a may be an anisotropic sheet in which a fiber having a tensile property in a specific direction is woven. For example, the first protective sheet 270a may be configured by an anisotropic sheet in which a tensile strength is relatively small in the rolling direction of the roller 151, that is, in a column direction and the tensile strength is relatively large in the row direction.

The second protective sheet 270b may be an isotropic sheet in which a fiber is woven to have a relatively large tensile strength in all directions.

As described above, according to the second exemplary embodiment of the present disclosure, the first protective sheet 270a having different tensile characteristics for every direction is applied to the rear surface of the back cover 110 at the upper end and the lower end of the panel area B, including the panel area B. Accordingly, it is possible to reduce the stress generated when the display unit DP is rolled and improve the lateral rigidity of the display unit DP.

Further, according to the second exemplary embodiment of the present disclosure, the second protective sheet 270b having the same tensile characteristic in all directions is applied to the rear surface of the back cover 110 of the edge of the panel area B to further improve the lateral rigidity of the back cover 110. That is, when the tensile strength for the rolling direction of the second protective sheet 270b at the edge of the back cover 110 is increased, the deformation above and below the impacted portion is reduced to reduce the overall deformed amount of the back cover 110.

As described above, according to the second exemplary embodiment of the present disclosure, different structures of the protective sheet 270 are applied for every position so that the required characteristic of the tensile strength in accordance with the positions may be maximized. The protective sheet 270 is woven with a structure suitable for the tensile characteristic for every position to be integrally manufactured to be attached onto the rear surface of the back cover 110, but is not limited thereto.

Figure 10A:
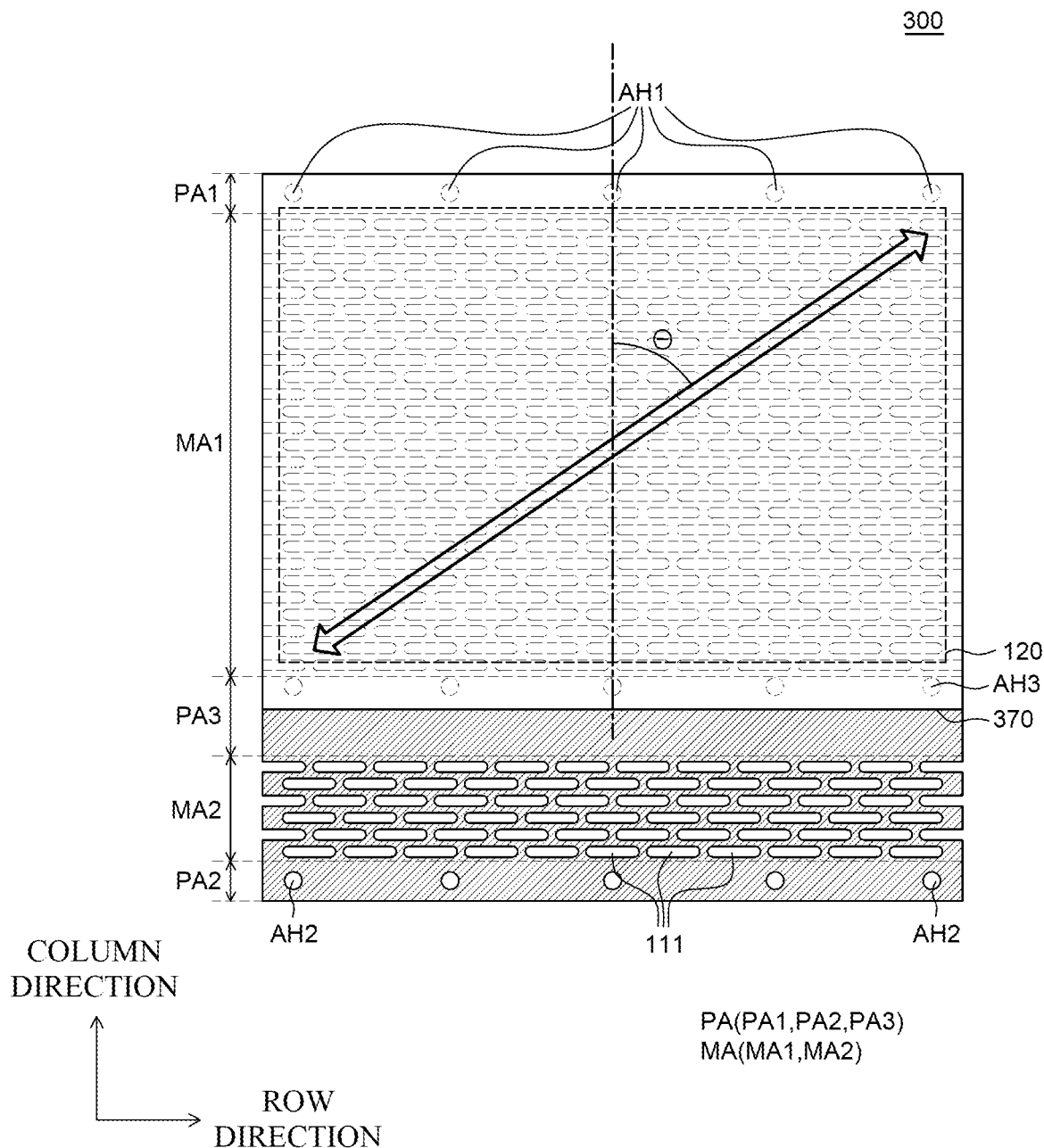
FIG. 10A is a rear view of a display device according to a third exemplary embodiment of the present disclosure.

FIG. 10A is a rear view of a display device according to a third exemplary embodiment of the present disclosure.

Figure 10B:
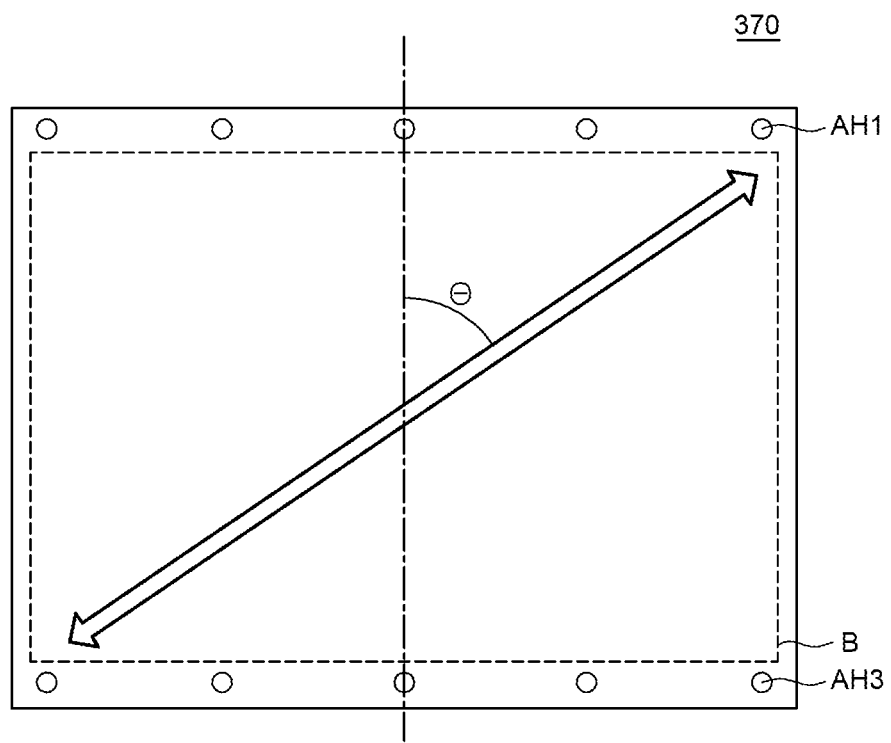
FIG. 10B is a plan view of a protective sheet according to a third exemplary embodiment of the present disclosure.

FIG. 10B is a plan view of a protective sheet according to a third exemplary embodiment of the present disclosure.

As compared with the display device of FIGS. 8A and 8B, in a display device 300 of FIGS. 10A and 10B, only a configuration of a protective sheet 370 is different, but other configurations are substantially the same so that a redundant description will be omitted. The same configuration will be denoted with the same reference numeral.

In FIG. 10A, for the convenience of description, among various configurations of the display device 300, only a back cover 110 and a protective sheet 370 are schematically illustrated and a display panel 120 is illustrated with dotted lines. In FIG. 10B, only the protective sheet 370 is schematically illustrated.

In FIGS. 10A and 10B, it is assumed that a rolling direction of the roller is parallel to a column direction.

Referring to FIGS. 10A and 10B, in the display device 300 according to the third exemplary embodiment of the present disclosure, the protective sheet 370 is disposed on the rear surface of the back cover 110.

Specifically, the protective sheet 370 may be disposed on an opposite surface of one surface of the back cover 110 on which the display panel 120 is disposed. As described above, the protective sheet 370 may be disposed to overlap a polarization plate 127 disposed on the display panel 120.

A size of the protective sheet 370 may be equal to or larger than the size of the display panel 120.

Similarly to the above-described second exemplary embodiment of the present disclosure, the protective sheet 370 according to the third exemplary embodiment of the present disclosure may be disposed so as to overlap the edge of the back cover 110. That is, the protective sheet 370 according to the third exemplary embodiment of the present disclosure may also be disposed at the edge of the back cover 110 in which the display panel 120 is not disposed, but is not limited thereto.

In the protective sheet 370 according to the third exemplary embodiment of the present disclosure, the rolling direction of the roller 151, that is, a column direction illustrated in FIGS. 10A and 10B and a tensile direction (a direction of the arrow) of the fiber are inclined at a predetermined angle θ. In this case, a balance between the rolling degree and the lateral rigidity is adjusted to cope with the requirement for different characteristics depending on the situation.

For example, in order to minimize the generation of the curls in accordance with the stretching direction of the polarization plate 127, the protective sheet 370 having a large tensile strength against the stretching direction of the polarization plate 127 is applied to minimize the curls of the entire display unit DP. Further, for example, when the rolling characteristic is important, the angle θ is set to be large and when the rigidity or the curl characteristic is important, the angle θ is set to be small.

Further, the protective sheet 370 according to the third exemplary embodiment of the present disclosure may be disposed not only in the panel area B to which the display panel 120 is attached, but also in the upper end, the lower end, and the edge of the panel area B. That is, the protective sheet 370 according to the third exemplary embodiment of the present disclosure may be disposed in the entire first support area PA1 and the entire first malleable area MA1 of the back cover 110, and a part of the third support area PA3, but is not limited thereto.

Figure 11A:
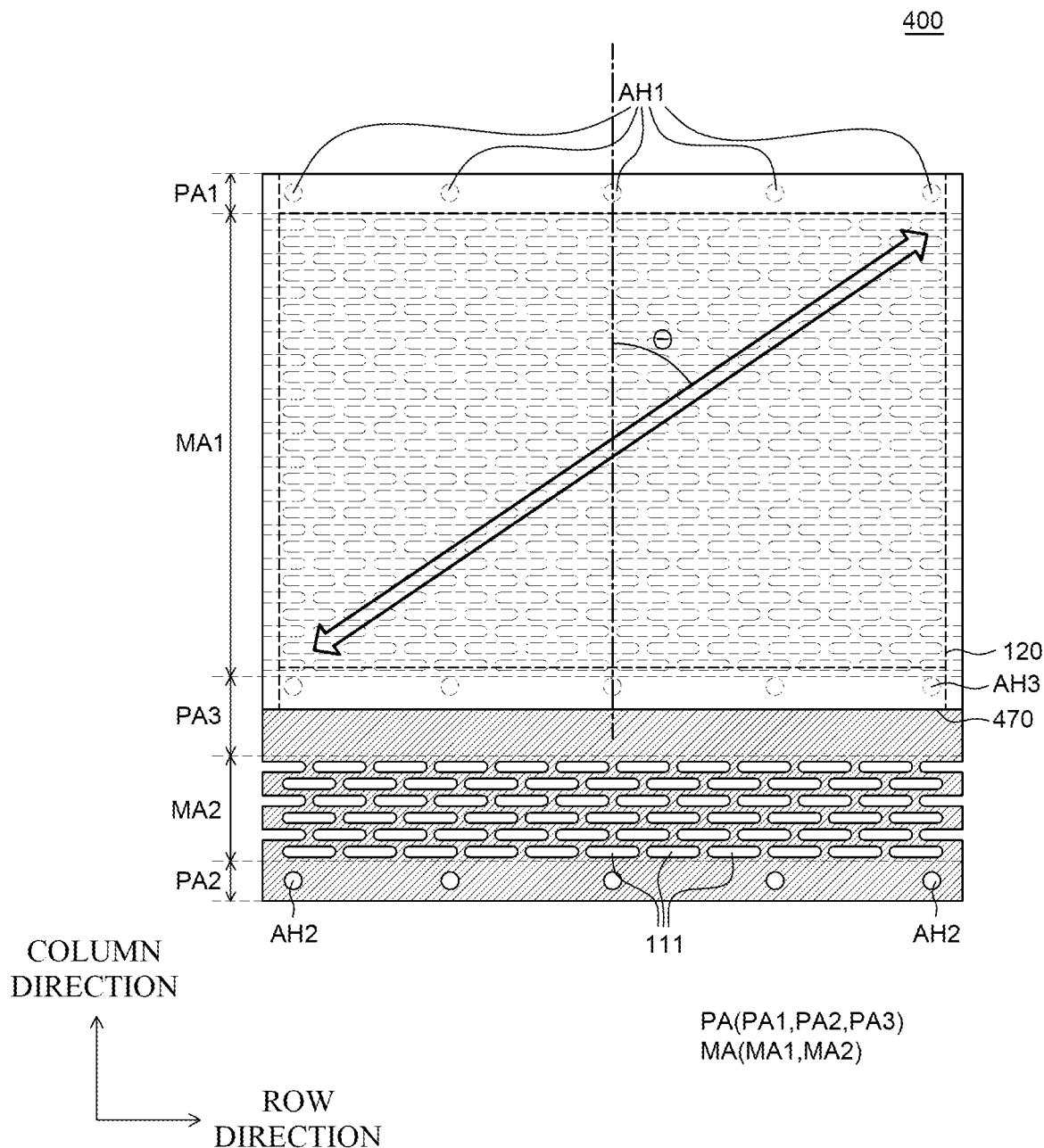
FIG. 11A is a rear view of a display device according to a fourth exemplary embodiment of the present disclosure.

FIG. 11A is a rear view of a display device according to a fourth exemplary embodiment of the present disclosure.

Figure 11B:
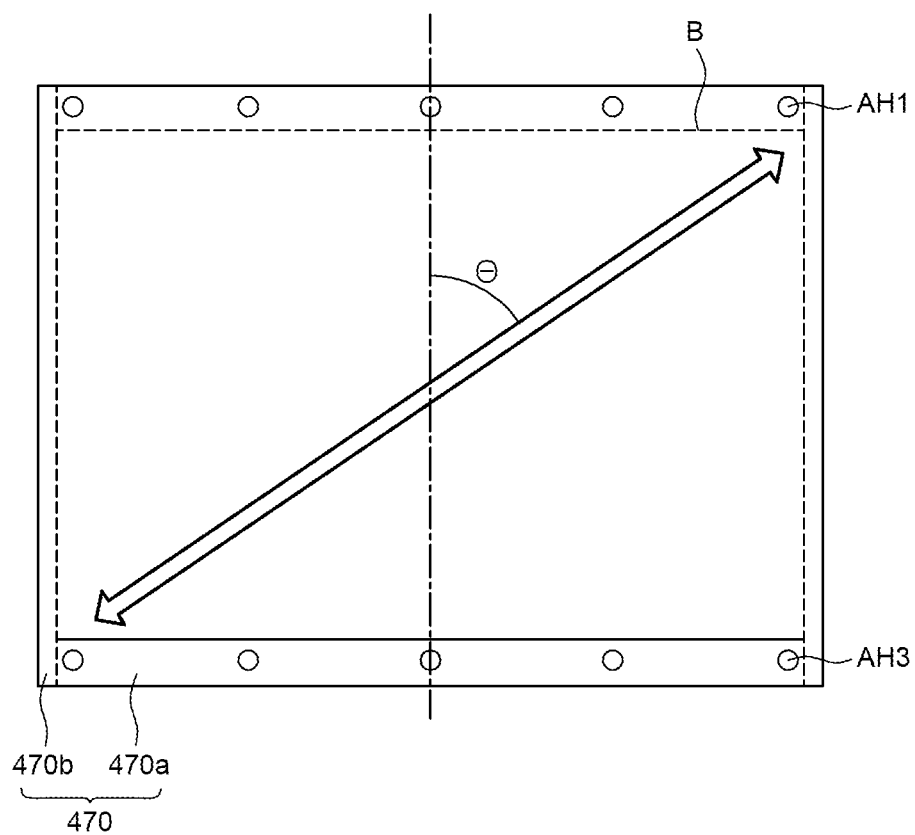
FIG. 11B is a plan view of a protective sheet according to a fourth exemplary embodiment of the present disclosure.

FIG. 11B is a plan view of a protective sheet according to a fourth exemplary embodiment of the present disclosure.

As compared with the display device of FIGS. 10A and 10B, in a display device 400 of FIGS. 11A and 11B, only a configuration of a protective sheet 470 is different, but other configurations are substantially the same so that a redundant description will be omitted. The same configuration will be denoted with the same reference numeral.

In FIG. 11A, for the convenience of description, among various configurations of the display device 400, only a back cover 110 and a protective sheet 470 are schematically illustrated and a display panel 120 is illustrated with dotted lines. In FIG. 11B, only the protective sheet 470 is schematically illustrated.

In FIGS. 11A and 11B, it is assumed that a rolling direction of the roller is parallel to a column direction.

Referring to FIGS. 11A and 11B, in the display device 400 according to the third exemplary embodiment of the present disclosure, the protective sheet 470 is disposed on the rear surface of the back cover 110.

Specifically, the protective sheet 470 may be disposed on an opposite surface of one surface of the back cover 110 on which the display panel 120 is disposed. As described above, the protective sheet 470 may be disposed to overlap a polarization plate 127 disposed on the display panel 120.

A size of the protective sheet 470 may be equal to or larger than the size of the display panel 120.

Similarly to the above-described first to third exemplary embodiments of the present disclosure, the protective sheet 470 according to the fourth exemplary embodiment of the present disclosure may be disposed so as to overlap the edge of the back cover 110. The protective sheet 470 according to the fourth exemplary embodiment of the present disclosure may also be disposed at the edge of the back cover 110 in which the display panel 120 is not disposed, but is not limited thereto.

Similarly to the above-described third exemplary embodiment of the present disclosure, in the protective sheet 470 according to the fourth exemplary embodiment of the present disclosure, the rolling direction of the roller 151, that is, a column direction illustrated in FIGS. 11A and 11B and a tensile direction (a direction of the arrow) of the fiber are inclined at a predetermined angle θ. In this case, a balance between the rolling degree and the lateral rigidity is adjusted to cope with the requirement for different characteristics depending on the situation.

Further, the protective sheet 470 according to the fourth exemplary embodiment of the present disclosure may be divided into at least two regions with different structures. That is, for example, the protective sheet 470 according to the fourth exemplary embodiment of the present disclosure includes a first protective sheet 470a and a second protective sheet 470b. The first protective sheet 470a is disposed in a panel area B in which the display panel 120 is disposed and in the back cover 110 of upper and lower ends of the panel area B, and the second protective sheet 470b is disposed in the back cover 110 of an edge of the panel area B. However, the present disclosure is not limited thereto and the second protective sheet 470b may be disposed in the back cover 110 at the upper and lower ends of the panel area B. Alternatively, a third protective sheet having a characteristic different from those of the first and second protective sheets 470a and 470b may be disposed in the back cover 110 at the upper and lower ends of the panel area B.

The first protective sheet 470a according to the fourth exemplary embodiment of the present disclosure may be disposed not only in the panel area B in which the display panel 120 is attached, but also in the back cover 110 of the upper end and the lower end of the panel area B. That is, the first protective sheet 470a may be disposed in the entire first support area PA1 and the entire first malleable area MA1 of the back cover 110, and a part of the third support area PA3 excluding the edge, but is not limited thereto.

Further, the second protective sheet 470*b* according to the fourth exemplary embodiment of the present disclosure may be disposed in the back cover 110 of the edge of the panel area B.

As described above, according to the fourth exemplary embodiment of the present disclosure, the first protective sheet 470*a* in which the rolling direction of the roller 151 and the tensile direction of the fiber are inclined at a predetermined angle θ is applied to the rear surface of the back cover 110 at the upper end and the lower end of the panel area B, including the panel area B. Therefore, a balance between the rolling degree and the lateral rigidity is adjusted to cope with the requirement for different characteristics depending on the situation.

Further, according to the fourth exemplary embodiment of the present disclosure, the second protective sheet 470*b* having the same tensile characteristic in all directions is applied to the rear surface of the back cover 110 of the edge of the panel area B to improve the lateral rigidity of the back cover 110. That is, when the tensile strength for the rolling direction of the second protective sheet 470*b* at the edge of the back cover 110 is increased, the deformation above and below the impacted portion is reduced to reduce the overall deformed amount of the back cover 110.

As described above, according to the fourth exemplary embodiment of the present disclosure, different structures of the protective sheet 470 are applied for every position so that the required characteristic of the tensile strength in accordance with the positions may be maximized. The protective sheet 470 is woven with a structure suitable for the tensile characteristic for every position to be integrally manufactured to be attached onto the rear surface of the back cover 110, but is not limited thereto.

Figure 12A:
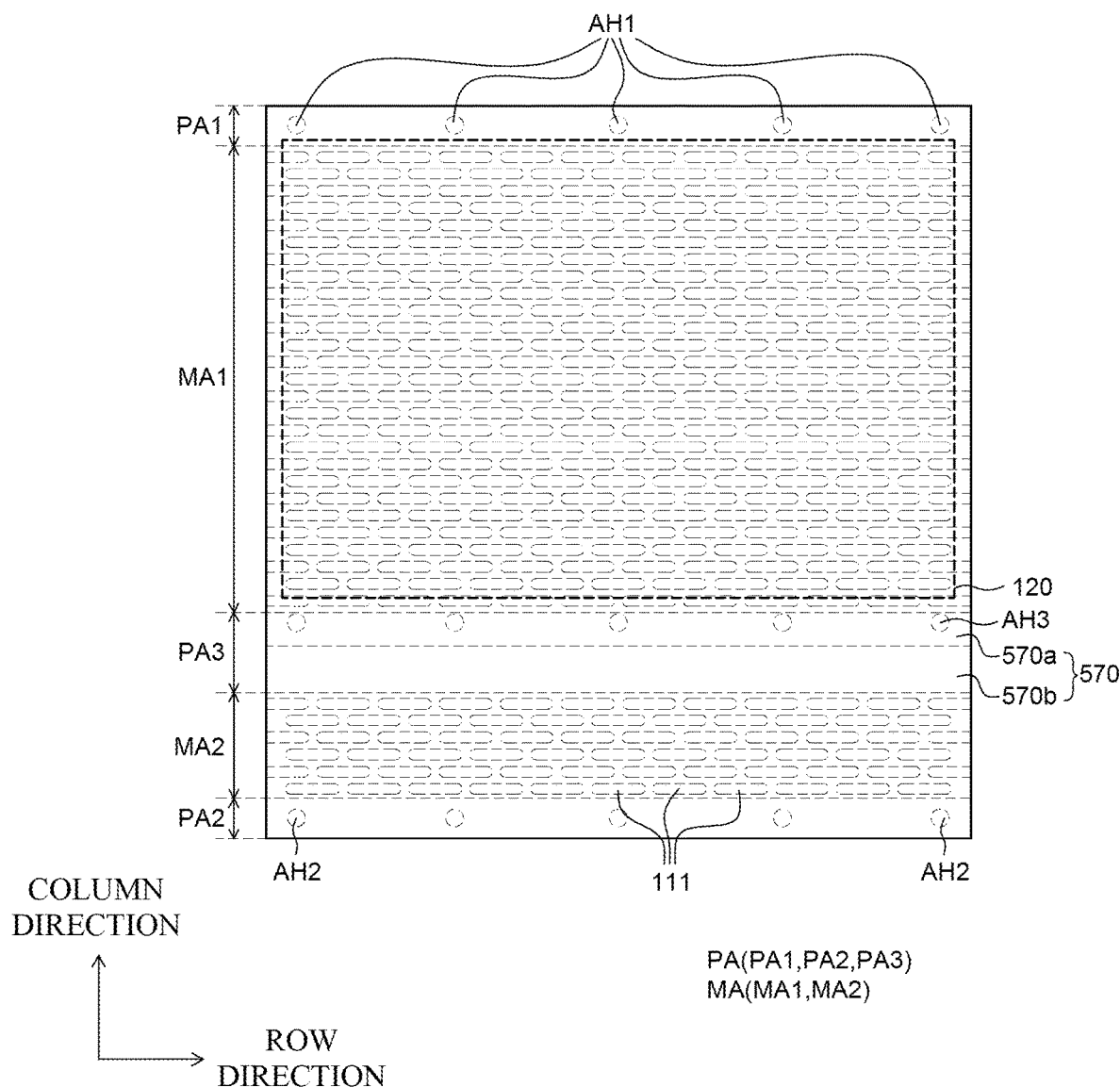
FIG. 12A is a rear view of a display device according to a fifth exemplary embodiment of the present disclosure.

FIG. 12A is a rear view of a display device according to a fifth exemplary embodiment of the present disclosure.

Figure 12B:
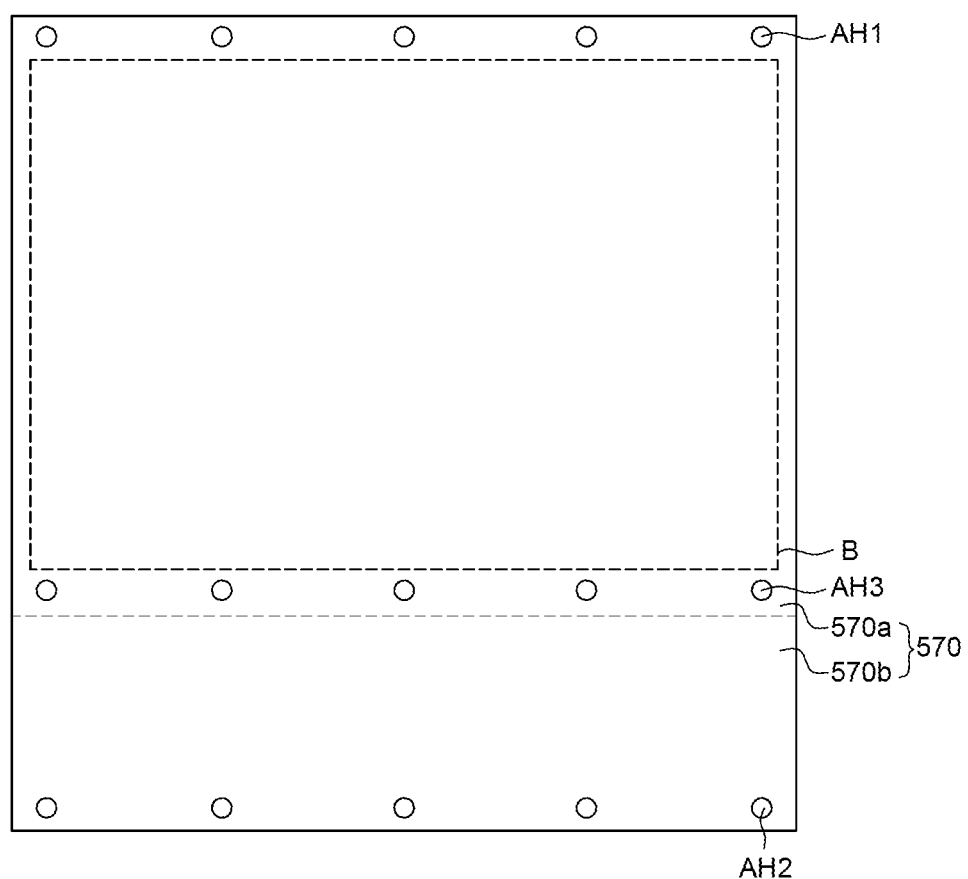
FIG. 12B is a plan view of a protective sheet according to a fifth exemplary embodiment of the present disclosure.

FIG. 12B is a plan view of a protective sheet according to a fifth exemplary embodiment of the present disclosure.

As compared with the display device of FIGS. 10A and 10B, in a display device 500 of FIGS. 12A and 12B, only a configuration of a protective sheet 570 is different, but other configurations are substantially the same so that a redundant description will be omitted. The same configuration will be denoted with the same reference numeral.

In FIG. 12A, for the convenience of description, among various configurations of the display device 500, only a back cover 110 and a protective sheet 570 are schematically illustrated and a display panel 120 is illustrated with dotted lines. In FIG. 12B, only the protective sheet 570 is schematically illustrated.

In FIGS. 12A and 12B, it is assumed that a rolling direction of the roller is parallel to a column direction.

Referring to FIGS. 12A and 12B, in the display device 500 according to the fifth exemplary embodiment of the present disclosure, the protective sheet 570 is disposed on the rear surface of the back cover 110.

Specifically, the protective sheet 570 may be disposed on an opposite surface of one surface of the back cover 110 on which the display panel 120 is disposed. As described above, the protective sheet 570 may be disposed to overlap a polarization plate 127 disposed on the display panel 120.

A size of the protective sheet 570 may be equal to or larger than the size of the display panel 120. Specifically, the protective sheet 570 according to the fifth exemplary embodiment of the present disclosure extends to the second support area PA2 of the back cover 110. However, the present disclosure is not limited thereto so that the display device may be configured by the back cover, the protective sheet, and an extending sheet at a lower end. Accordingly, according to the fifth exemplary embodiment of the present disclosure, the protective sheet 570 extends to the second support area PA2 of the back cover 110 to replace the lower extending sheet. The second protective sheet 570*b* which replaces the lower extending sheet should not have a tensile characteristic (i.e., has a constant tensile strength) and is fastened with the back cover 110 through the second and third fastening holes AH2 and AH3 so that a separate fastening structure may be removed.

That is, the protective sheet 570 according to the fifth exemplary embodiment of the present disclosure includes a first protective sheet 570*a* and a second protective sheet 570*b*. The first protective sheet 570*a* is disposed in a panel area B, in which the display panel 120 is disposed, the back cover 110 of upper and lower ends of the panel area B, and the second protective sheet 570*b* extends to the second support area PA2 of the back cover 110 to replace the lower extending sheet, but is not limited thereto.

The first protective sheet 570*a* may be an anisotropic sheet.

The first protective sheet 570*a* may be an anisotropic sheet in which a fiber having a tensile property in a specific direction is woven. For example, the first protective sheet 570*a* may be configured by an anisotropic sheet in which a tensile strength is relatively small in the rolling direction of the roller 151, that is, in a column direction and the tensile strength is relatively large in the row direction.

The second protective sheet 570*b* may be a sheet from which the tensile characteristic is removed.

Similarly to the above-described first to fourth exemplary embodiments of the present disclosure, the protective sheet 570 according to the fifth exemplary embodiment of the present disclosure may be disposed so as to overlap the edge of the back cover 110. The protective sheet 570 according to the fifth exemplary embodiment of the present disclosure may also be disposed at the edge of the back cover 110 in which the display panel 120 is not disposed, but is not limited thereto.

Figure 13A:
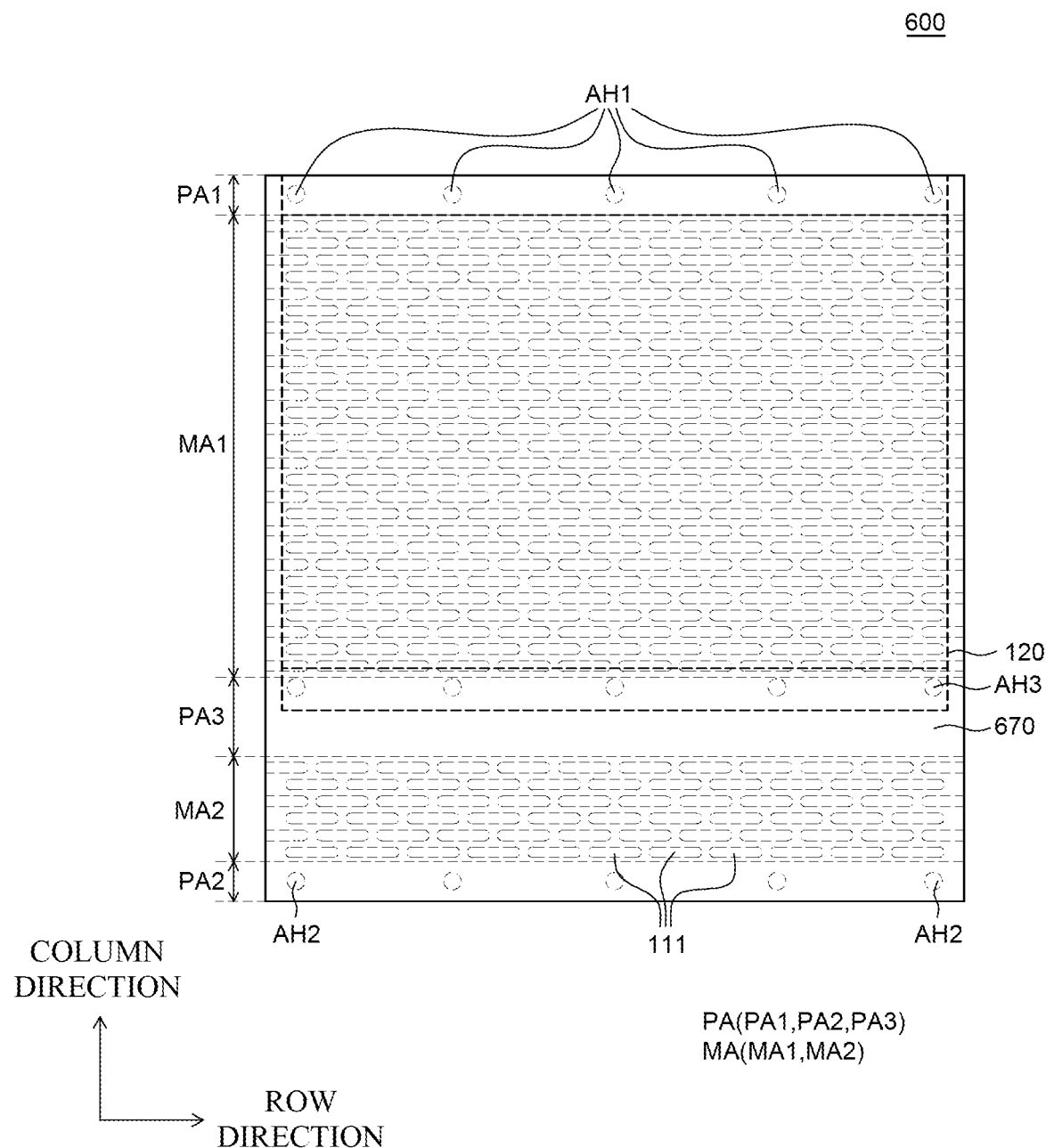
FIG. 13A is a rear view of a display device according to a sixth exemplary embodiment of the present disclosure.

FIG. 13A is a rear view of a display device according to a sixth exemplary embodiment of the present disclosure.

Figure 13B:
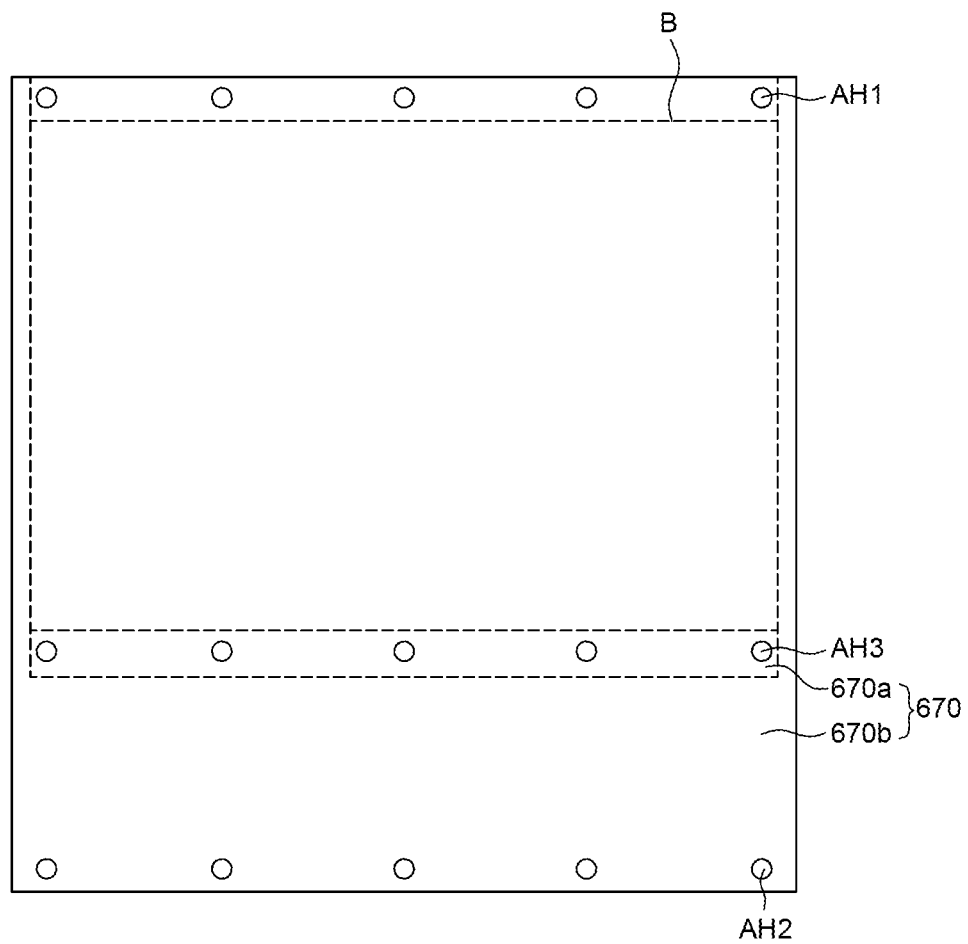
FIG. 13B is a plan view of a protective sheet according to a sixth exemplary embodiment of the present disclosure.

FIG. 13B is a plan view of a protective sheet according to a sixth exemplary embodiment of the present disclosure.

As compared with the display device of FIGS. 10A and 10B, in a display device 600 of FIGS. 13A and 13B, only a configuration of a protective sheet 670 is different, but other configurations are substantially the same so that a redundant description will be omitted. The same configuration will be denoted with the same reference numeral.

In FIG. 13A, for the convenience of description, among various configurations of the display device 600, only a back cover 110 and a protective sheet 670 are schematically illustrated and a display panel 120 is illustrated with dotted lines. In FIG. 13B, only the protective sheet 670 is schematically illustrated.

In FIGS. 13A and 13B, it is assumed that a rolling direction of the roller is parallel to a column direction.

Referring to FIGS. 13A and 13B, in the display device 600 according to the sixth exemplary embodiment of the present disclosure, the protective sheet 670 is disposed on the rear surface of the back cover 110.

Specifically, the protective sheet 670 may be disposed on an opposite surface of one surface of the back cover 110 on which the display panel 120 is disposed. As described above, the protective sheet 670 may be disposed to overlap a polarization plate 127 disposed on the display panel 120.

A size of the protective sheet 670 may be equal to or larger than the size of the display panel 120.

Similarly to the above-described first to fifth exemplary embodiments of the present disclosure, the protective sheet 670 according to the sixth exemplary embodiment of the present disclosure may be disposed so as to overlap the edge of the back cover 110. The protective sheet 670 according to the sixth exemplary embodiment of the present disclosure may also be disposed at the edge of the back cover 110 in which the display panel 120 is not disposed, but is not limited thereto.

In the meantime, the protective sheet 670 according to the sixth exemplary embodiment of the present disclosure includes a first protective sheet 670a and a second protective sheet 670b. The first protective sheet 670a is disposed in a panel area B in which the display panel 120 is disposed and in the back cover 110 of upper and lower ends of the panel area B. The second protective sheet 670b is disposed to extend to the back cover 110 of an edge of the panel area B and the second support area PA2 of the back cover 110, but is not limited thereto.

The first protective sheet 670a may be an anisotropic sheet.

The first protective sheet 670a may be an anisotropic sheet in which a fiber having a tensile property in a specific direction is woven. For example, the first protective sheet 670a may be configured by an anisotropic sheet in which a tensile strength is relatively small in the rolling direction of the roller 151, that is, in a column direction and the tensile strength is relatively large in the row direction.

The second protective sheet 670b may be a sheet from which the tensile characteristic is removed.

Figure 14A:
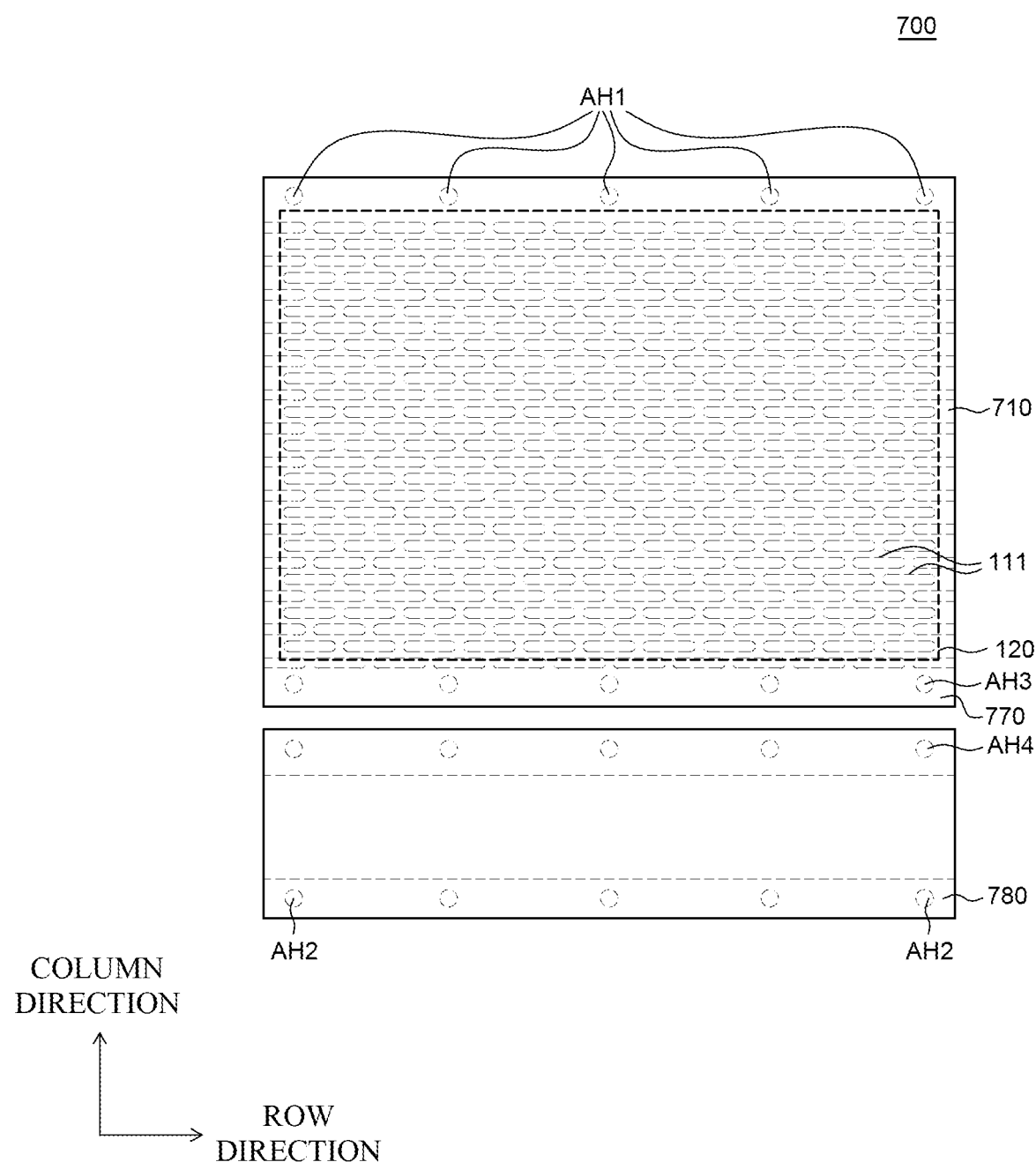
FIG. 14A is a rear view of a display device according to a seventh exemplary embodiment of the present disclosure.

FIG. 14A is a rear view of a display device according to a seventh exemplary embodiment of the present disclosure.

Figure 14B:
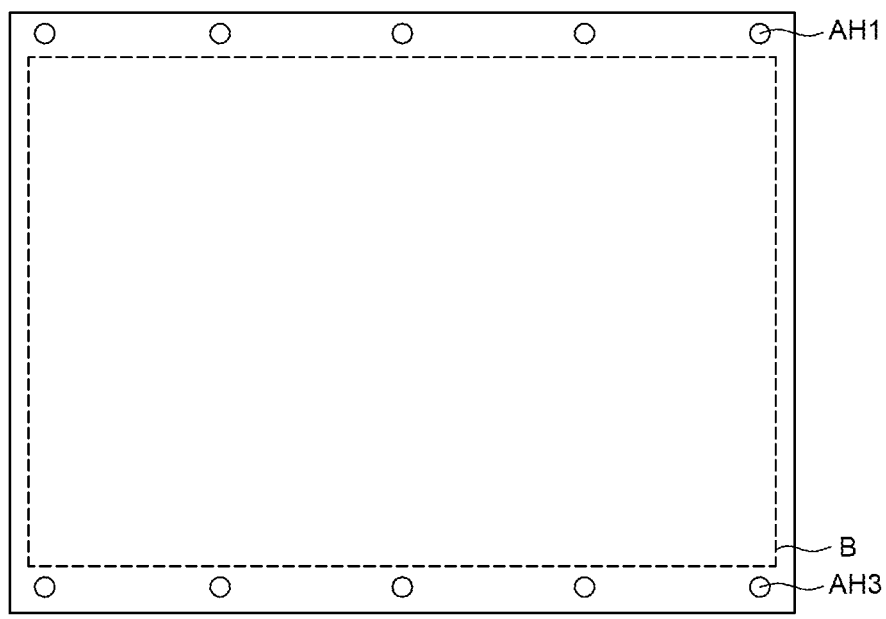
FIG. 14B is a plan view of a protective sheet according to a seventh exemplary embodiment of the present disclosure.

FIG. 14B is a plan view of a protective sheet according to a seventh exemplary embodiment of the present disclosure.

As compared with the display devices described above, in a display device 700 of FIGS. 14A and 14B, only configurations of a back cover 710 and an extending sheet 780 are different, but other configurations are substantially the same so that a redundant description will be omitted. The same configuration will be denoted with the same reference numeral.

In FIG. 14A, for the convenience of description, among various configurations of the display device 700, only a back cover 710, an extending sheet 780, and a protective sheet 770 are schematically illustrated and a display panel 120 is illustrated with dotted lines. In FIG. 14B, only the protective sheet 770 is schematically illustrated.

In FIGS. 14A and 14B, it is assumed that a rolling direction of the roller is parallel to a column direction.

Referring to FIGS. 14A and 14B, in the display device 700 according to the seventh exemplary embodiment of the present disclosure, the protective sheet 770 is disposed on the rear surface of the back cover 710.

Specifically, the protective sheet 770 may be disposed on an opposite surface of one surface of the back cover 710 on which the display panel 120 is disposed. As described above, the protective sheet 770 may be disposed to overlap a polarization plate 127 disposed on the display panel 120.

A size of the protective sheet 770 may be equal to or larger than the size of the display panel 120.

Specifically, at the lower end of the back cover 710 according to the seventh exemplary embodiment of the present disclosure, the extending sheet 780 is provided instead of the back cover. Accordingly, according to the seventh exemplary embodiment of the present disclosure, first and third fastening holes AH1 and AH3 are provided at upper and lower ends of the back cover 710 to be fastened with the protective sheet 770. Further, fourth and second fastening holes AH4 and AH2 are provided at upper and lower ends of the extending sheets 780 to be fastened with the roller 151, but it is not limited thereto.

The back cover 710 and the extending sheet 780 may be fastened with each other through the third fastening hole AH3 and the fourth fastening hole AH4 and the protective sheet 770 may be fastened with the extending sheet 780 by means of the fourth fastening hole AH4.

The back cover 710 is formed of a metal material, but the extending sheet 780 may be formed of a material such as plastic, but is not limited thereto.

The protective sheet 770 of the seventh exemplary embodiment of the present disclosure may be disposed in a panel area B in which the display panel 120 is disposed and in the back cover 710 at upper and lower ends and an edge of the panel area. However, the present disclosure is not limited thereto, so that the protective sheet extends to the extending sheet 780 to be fastened with the extending sheet 780.

The protective sheet 770 may be an anisotropic sheet.

The protective sheet 770 may be an anisotropic sheet in which a fiber having a tensile property in a specific direction is woven. For example, the protective sheet 770 may be configured by an anisotropic sheet in which a tensile strength is relatively small in the rolling direction of the roller 151, that is, in a column direction and the tensile strength is relatively large in the row direction.

The exemplary embodiments of the present disclosure can also be described as follows:

According to an aspect of the present disclosure, there is provided a display device. The display device includes a display panel in which a plurality of pixels is defined, a back cover disposed on a rear surface of the display panel, a roller which is connected to the back cover to wind or unwind the back cover and the display panel, and a protective sheet which is disposed on a rear surface of the back cover and has a relatively small tensile strength in a rolling direction of the roller.

The display device may further include a polarization plate disposed on an upper surface of the display panel, wherein the protective sheet may be disposed so as to overlap the polarization plate.

The protective sheet may be equal to or larger than the display panel.

The display panel may be not disposed at an edge of the back cover and the protective sheet may be disposed so as to overlap an edge of the back cover.

At least one first fastening hole may be formed at an upper end of the protective sheet and the back cover and the protective sheet may be fastened with each other by means of the first fastening hole.

At least one second fastening hole may be formed at a lower end of the back cover, and the back cover and the roller may be fastened with each other by means of the second fastening hole.

At least one third fastening hole may be formed at a lower end of the protective sheet and the back cover and the protective sheet may be fastened with each other by means of the third fastening hole.

The protective sheet may be configured by an anisotropic sheet in which a fiber is woven.

The protective sheet may be configured by an anisotropic sheet in which a tensile strength is relatively small in a rolling direction of the roller and is relatively large in a direction perpendicular to the rolling direction.

The protective sheet may be disposed in a panel area of the back cover in which the display panel is attached.

The protective sheet may be also disposed at upper and lower ends and an edge of the panel area.

The protective sheet may be configured such that a tensile direction of the fiber is inclined with respect to the rolling direction of the roller at an angle.

The protective sheet may include at least one of a first protective sheet which is disposed at upper and lower ends of the panel area, including the panel area, and a second protective sheet disposed at the edge of the panel area.

The first protective sheet may be configured by an anisotropic sheet in which a tensile strength is relatively small in the rolling direction of the roller and is relatively large in a direction perpendicular to the rolling direction, and the second protective sheet may be configured by an isotropic sheet having a tensile strength which is relatively large in all directions.

The display device may further include a polarization plate which is disposed on an upper surface of the display panel and includes a polarization layer extending in one direction, wherein the protective sheet may have a tensile strength which is relatively large in a stretching direction of the polarization plate.

The protective sheet may include a first protective sheet which is disposed at upper and lower ends and an edge of the panel area, including the panel area, and a second protective sheet disposed to extend to a lower end of the back cover connected to the roller.

The first protective sheet may be configured by an anisotropic sheet in which a tensile strength is relatively small in the rolling direction of the roller and is relatively large in a direction perpendicular to the rolling direction, and the second protective sheet may be configured by a sheet from which a tensile characteristic is removed.

According to another aspect of the present disclosure, there is provided a display device. The display device includes a display panel in which a plurality of pixels is defined, a back cover disposed on a rear surface of the display panel, an extending sheet which is disposed at a lower end of the back cover to be fastened with the back cover, a roller which is connected to the extending sheet to wind or unwind the back cover and the display panel, and a protective sheet which is disposed on a rear surface of the back cover and has a relatively small tensile strength in a rolling direction of the roller.

The protective sheet may be configured by an anisotropic sheet in which a tensile strength is relatively small in a rolling direction of the roller and is relatively large in a direction perpendicular to the rolling direction.

The protective sheet may be also disposed at upper and lower ends and an edge of the panel area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
   a display panel including a plurality of pixels;
   a back cover disposed on a rear surface of the display panel;
   a roller coupled to the back cover and the roller structured to wind or unwind the back cover and the display panel; and
   a protective sheet disposed on a rear surface of the back cover, the protective sheet having a first tensile strength in a first direction and a second tensile strength in a second direction, the second direction different from the first direction and the second tensile strength being greater than the first tensile strength,
   wherein the first direction is a rolling direction of the roller and the second direction is perpendicular to the rolling direction.

2. The display device according to claim 1, further comprising:
   a polarization plate disposed on an upper surface of the display panel,
   wherein the protective sheet is disposed so as to overlap the polarization plate.

3. The display device according to claim 1, wherein the protective sheet has a size that is equal to or larger than a size of the display panel.

4. The display device according to claim 3, wherein the display panel is not disposed at an edge of the back cover and the protective sheet is disposed so as to overlap the edge of the back cover.

5. The display device according to claim 1, wherein the protective sheet includes at least one first fastening hole at an upper end of the protective sheet, the back cover and the protective sheet coupled to each other via the at least one first fastening hole.

6. The display device according to claim 5, wherein the back cover includes at least one second fastening hole at a lower end of the back cover, the back cover and the roller coupled to each other via the at least one second fastening hole.

7. The display device according to claim 6, wherein the protective sheet includes at least one third fastening hole at a lower end of the protective sheet, the back cover and the protective sheet coupled to each other via the at least one third fastening hole.

8. The display device according to claim 1, wherein the protective sheet is an anisotropic sheet with a woven fiber.

9. The display device according to claim 8, wherein a tensile direction of the woven fiber of the protective sheet is inclined with respect to the rolling direction of the roller at an angle.

10. The display device according to claim 8, wherein the back cover includes a panel area and the protective sheet includes at least one of: a first protective sheet disposed at upper and lower ends of the panel area and including the panel area, and a second protective sheet disposed at an edge of the panel area.

11. The display device according to claim 10, wherein the first protective sheet is an anisotropic sheet in which a tensile strength in the first direction is less than a tensile strength in the second direction, and the second protective sheet is an isotropic sheet having a tensile strength in all directions greater than the tensile strength of the first protective sheet in the first direction.

12. The display device according to claim 10, further comprising:
a polarization plate disposed on an upper surface of the display panel and including a polarization layer,
wherein the protective sheet has a tensile strength in a stretching direction of the polarization plate greater than the tensile strength of the protective sheet in the first direction.

13. A display device comprising:
a display panel including a plurality of pixels;
a back cover disposed on a rear surface of the display panel;
a roller coupled to the back cover and the roller structured to wind or unwind the back cover and the display panel; and
a protective sheet disposed on a rear surface of the back cover, the protective sheet having a first tensile strength in a first direction and a second tensile strength in a second direction,
wherein the protective sheet is an anisotropic sheet with a woven fiber, and
wherein the display panel is coupled to a panel area of the back cover, and the protective sheet is disposed in the panel area of the back cover, and
wherein a tensile direction of the woven fiber of the protective sheet is inclined at an angle with respect to the first direction.

14. The display device according to claim 13, wherein the protective sheet is disposed at upper and lower ends of the panel area and at an edge of the panel area.

15. The display device according to claim 13, wherein the protective sheet includes:
a first protective sheet disposed in the panel area and at upper and lower ends and at an edge of the panel area of the back cover; and
a second protective sheet extending to a lower end of the back cover connected to the roller.

16. The display device according to claim 15, wherein the first protective sheet is an anisotropic sheet having a tensile strength in the first direction less than a tensile strength in the second direction, and the second protective sheet is a sheet with a constant tensile strength.

17. A display device, comprising:
a display panel;
a back cover disposed on a rear surface of the display panel;
an extending sheet disposed at a lower end of the back cover and coupled to the back cover;
a roller coupled to the extending sheet and structured to wind or unwind the back cover and the display panel; and
a protective sheet disposed on a rear surface of the back cover and the protective sheet having a first tensile strength in a first direction of the protective sheet different from a second tensile strength in a second direction of the protective sheet,
wherein the first direction is a rolling direction of the roller and the second direction is perpendicular to the rolling direction.

18. The display device according to claim 17, wherein the protective sheet is an anisotropic sheet in which the first tensile strength is less than the second tensile strength.

19. The display device according to claim 17, wherein back cover includes a panel area and the protective sheet is disposed at upper and lower ends and an edge of the panel area of the back cover.

* * * * *